(12) United States Patent
Bellaouar et al.

(10) Patent No.: US 12,146,902 B2
(45) Date of Patent: Nov. 19, 2024

(54) POWER DETECTOR

(71) Applicant: QUALCOMM Incorporated, San Diego, CA (US)

(72) Inventors: Abdellatif Bellaouar, Richardson, TX (US); Arul Balasubramaniyan, Plano, TX (US); Gurkanwal Singh Sahota, Rancho Santa Fe, CA (US); Muhammad Hassan, San Diego, CA (US); Jorge Garcia, San Diego, CA (US); Bhushan Shanti Asuri, San Diego, CA (US); Ravi Sridhara, San Diego, CA (US); Omar Essam El-Aassar, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 18/306,616

(22) Filed: Apr. 25, 2023

(65) Prior Publication Data
US 2023/0258699 A1    Aug. 17, 2023

Related U.S. Application Data

(62) Division of application No. 16/932,589, filed on Jul. 17, 2020, now Pat. No. 11,656,254.

(51) Int. Cl.
*G01R 21/10*  (2006.01)
*G01R 21/133* (2006.01)
(Continued)

(52) U.S. Cl.
CPC ........... *G01R 21/10* (2013.01); *G01R 21/133* (2013.01); *H03F 3/45475* (2013.01);
(Continued)

(58) Field of Classification Search
CPC ..... G01R 21/10; G01R 21/133; H03F 1/0272; H03F 2200/105; H03F 2200/171;
(Continued)

(56) References Cited

U.S. PATENT DOCUMENTS 3,459,925 A    8/1969  Goosey et al.
8,223,031 B1   7/2012  Allen et al.
(Continued)

FOREIGN PATENT DOCUMENTS

WO    2009066274 A1    5/2009

OTHER PUBLICATIONS

Francois B., et al., "A Fully Integrated Transformer-Coupled Power Detector With 5 Ghz RF PA for WLAN 802.11ac in 40 nm CMOS," IEEE Journal of Solid-State Circuits, vol. 50, No. 5, May 2015, pp. 1237-1250.
(Continued)

*Primary Examiner* — Vinh P Nguyen
(74) *Attorney, Agent, or Firm* — QUALCOMM Incorporated

(57) ABSTRACT

In certain aspects, a method is provided for measuring power using a resistive element coupled between a power amplifier and an antenna. The method includes squaring a voltage from a first terminal of the resistive element to obtain a first signal, squaring a voltage from a second terminal of the resistive element to obtain a second signal, and generating a measurement signal based on a difference between the first signal and the second signal. In some implementations, the resistive element is implemented with a power switch.

20 Claims, 21 Drawing Sheets

(51) Int. Cl.
  *H03F 3/45* (2006.01)
  *H03M 1/12* (2006.01)
(52) U.S. Cl.
  CPC .. *H03F 2200/171* (2013.01); *H03F 2200/294* (2013.01); *H03F 2200/451* (2013.01); *H03M 1/12* (2013.01)
(58) Field of Classification Search
  CPC ......... H03F 2200/228; H03F 2200/294; H03F 2200/451; H03F 2200/465; H03F 2200/471; H03F 3/189; H03F 3/245; H03F 3/45475; H03M 1/12
  See application file for complete search history.

(56) References Cited

U.S. PATENT DOCUMENTS

| | | | |
|---|---|---|---|
| 8,301,091 | B2 | 10/2012 | Vice et al. |
| 8,570,025 | B2 * | 10/2013 | Heaney ............... H03K 17/6871 324/705 |
| 8,611,845 | B2 | 12/2013 | Basawapatna |
| 8,744,379 | B1 | 6/2014 | Sung |
| 9,382,558 | B2 | 7/2016 | Randhava et al. |
| 10,901,009 | B2 * | 1/2021 | Khatib .................... H03F 3/211 |
| 2008/0125061 | A1 | 5/2008 | Kuriyama et al. |
| 2011/0115507 | A1 | 5/2011 | Heaney |
| 2011/0201281 | A1 | 8/2011 | Bakalski et al. |
| 2013/0027110 | A1 | 1/2013 | Beale et al. |
| 2013/0324057 | A1 | 12/2013 | Zhang et al. |
| 2013/0331042 | A1 | 12/2013 | See et al. |
| 2022/0018882 | A1 | 1/2022 | Bellaouar et al. |

OTHER PUBLICATIONS

Gu Q.J., et al., "A D-Band Passive Imager in 65 nm CMOS", IEEE Microwave and Wireless Components Letters, IEEE Service Center, New York, NY, US, vol. 22, No. 5, May 1, 2012 (May 1, 2012), pp. 263-265, XP011443328, ISSN: 1531-1309, Doi: 10.1109/LMWC.2012.2192720 Abstract Figure 3 Figure 1.

International Preliminary Report on Patentability—PCT/US2021/040474—The International Bureau of WIPO—Geneva, Switzerland—Jan. 26, 2023.

International Search Report and Written Opinion—PCT/US2021/040474—ISA/EPO—Jan. 26, 2022.

Lin D., et al., "A Fully Differential IR-UWB Front-End for Noncoherent Communication and Localization", Ultra-Wideband (ICUWB), 2011 IEEE International Conference on, IEEE, Sep. 14, 2011 (Sep. 14, 2011), pp. 116-120, XP032115630, DOI: 10.1109/ICUWB.2011.6058807 ISBN: 978-1-4577-1763-5 Abstract Figures 1-2 Figure 9.

Pfeiffer U.R., et al., "A 20 dBm Fully-Integrated 60 GHz SiGe Power Amplifier with Automatic Level Control", IEEE Journal of Solid-State Circuits, IEEE, USA, vol. 42, No. 7, Jul. 1, 2007 (Jul. 7, 2007), pp. 1455-1463, XP011186325, ISSN: 0018-9200, DOI: 10.1109/JSSC.2007.899116 Abstract Figure 7 Figures 1-2 p. 1456-p. 1460.

Qunaj V., et al., "An E-band Fully-Integrated True Power Detector in 28nm CMOS," IEEE Radio Frequency Integrated Circuits Symposium (RFIC), 2019, pp. 191-194.

Roy A.G., et al., "A 37-40 GHz Phased Array Front-end with Dual Polarization for 5G Mimo Beamforming Applications", Tu1E-5, IEEE MTT-S Radio Frequency Integrated Circuits Symposium (RFIC), Intel Corp, Jun. 2019, 35 Pages.

Talha G.M., et al., "A 60 GHz Switched-Line Type Phase Shifter using Body-Floating Switches", 2013 International SOC Design Conference (ISOCC), IEEE, Nov. 17, 2013 (Nov. 17, 2013), pp. 353-355, XP032625204, DOI: 10.1109/ISOCC.2013.6864048 [Retrieved on Jul. 24, 2014] Abstract Figure 1 p. 354-p. 354, Figure 1a.

Xiao L., et al., "A Low-Power Sensor Interface Circuit for Remotely Powered Implants", Proceedings of the 2013 9TH Conference on PH.D. Research in Microelectronics and Electronics (PRIME), IEEE, Jun. 24, 2013 (Jun. 24, 2013), pp. 321-324, XP032483919, DOI: 10.1109/PRIME.2013.6603173 ISBN: 978-1-4673-4580-4 [Retrieved on Sep. 17, 2013] Abstract Figure 2 II. System Overview.

* cited by examiner

POWER DETECTOR

RELATED APPLICATION

The present application is a divisional of U.S. application Ser. No. 16/932,589, filed on Jul. 17, 2020, the entire specification of which is incorporated herein by reference.

BACKGROUND

Field

Aspects of the present disclosure relate generally to wireless communications, and, more particularly, to power detectors for measuring power.

Background

A wireless transmitter may include a power amplifier and an antenna for transmitting a radio frequency (RF) signal. The transmitter may also include a power detector for measuring the power delivered to the antenna from the power amplifier. The measured power may be input to a power control circuit configured to control the output power of the power amplifier based on the measured power.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a resistive element including a first terminal and a second terminal, wherein the resistive element is coupled between a power amplifier and an antenna. The apparatus also includes a first squaring circuit including an input and an output, wherein the input of the first squaring circuit is coupled to the first terminal of the resistive element, and a second squaring circuit including an input and an output, wherein the input of the second squaring circuit is coupled to the second terminal of the resistive element. The apparatus further includes a differential amplifier including a first input, a second input, and an output, wherein the first input of the differential amplifier is coupled to the output of the first squaring circuit, and the second input of the differential amplifier is coupled to the output of the second squaring circuit.

A second aspect relates to an apparatus. The apparatus includes a resistive element including a first terminal and a second terminal, wherein the resistive element is coupled between a power amplifier and an antenna. The apparatus also includes a first squaring circuit including an input and an output, wherein the input of the first squaring circuit is coupled to the first terminal of the resistive element, and a second squaring circuit including an input and an output, wherein the input of the second squaring circuit is coupled to the second terminal of the resistive element. The apparatus further includes a transformer, wherein the transformer includes a first inductor coupled between the first terminal of the resistive element and the second terminal of the resistive element, and a second inductor coupled between the input of the first squaring circuit and the input of the second squaring circuit, wherein the second inductor is magnetically coupled with the first inductor. The apparatus further includes a difference circuit coupled to the output of the first squaring circuit and the output of the second squaring circuit.

A third aspect relates to a method for measuring power using a resistive element coupled between a power amplifier and an antenna. The method includes squaring a voltage from a first terminal of the resistive element to obtain a first signal, squaring a voltage from a second terminal of the resistive element to obtain a second signal, inputting the first signal to a first input of a differential amplifier, inputting the second signal to a second input of the differential amplifier, and obtaining a measurement signal at an output of the differential amplifier.

BRIEF DESCRIPTION OF THE DRA WINGS

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
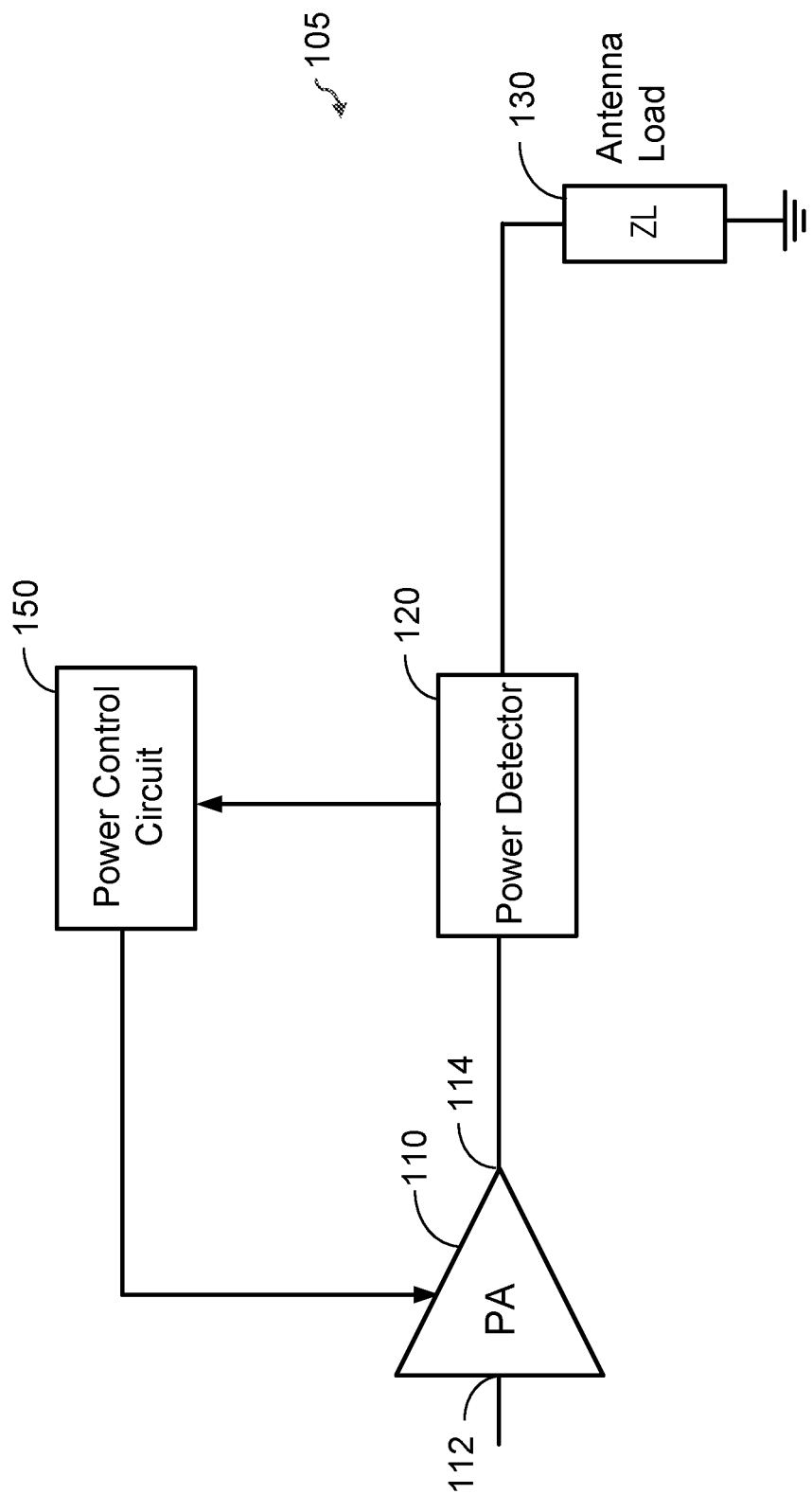
FIG. 1 shows an example of a transmitter including a power amplifier, a power detector, and an antenna according to certain aspects of the present disclosure.

A wireless transmitter may include a power amplifier and an antenna for transmitting a radio frequency (RF) signal. The transmitter may also include a power detector for measuring the power delivered to the antenna from the power amplifier. In this regard, FIG. 1 shows an example of a transmitter 105 including a power amplifier 110, an antenna 130, and a power detector 120 for measuring the power delivered to the antenna 130. The transmitter 105 may be incorporated in a wireless device (e.g., a mobile wireless device). Although one power amplifier 110, one antenna 130, and one power detector 120 are shown in FIG. 1, it is to be appreciated that the wireless device may include multiple power amplifiers, multiple antennas (e.g., arranged in an array), and multiple power detectors, in which each of the power detectors measures the power delivered to a respective one of the antennas.

The power amplifier 110 is configured to receive a radio frequency (RF) signal at the input 112 of the power amplifier 110, amplify the received RF signal, and output the amplified RF signal at the output 114 of the power amplifier 110 for wireless transmission via the antenna 130. The power detector 120 is configured to measure the power (e.g., average power) delivered to the antenna 130 from the power amplifier 110.

The measured power may be input to a power control circuit 150 configured to control the output power of the power amplifier 110 based on the measured power. For example, the power control circuit 150 may adjust the output power of the power amplifier 110 based on the measured power to keep the power delivered to the antenna 130 at or close to a target transmission power, as discussed further below. In another example, the measured power may be used to detect a failure of the power amplifier 110 and/or the antenna 130. The power control circuit 150 may adjust the output power of the power amplifier 110 by adjusting the supply voltage to the power amplifier 110, adjusting the amplitude of the RF signal input to the power amplifier 110, or another technique.

In one approach, the power detector 120 includes a voltage sensor (not shown) configured to sense the voltage across the antenna 130 and a current sensor configured to sense the current through the antenna 130, in which the current sensor is implemented with a current sensing coil. In this approach, the power detector 120 measures power by multiplying the sensed voltage from the voltage detector with the sensed current from the current sensor (e.g., using a mixer). A drawback of this approach is that there is a phase offset between the voltage sensor and the current sensor, which varies across process, frequency and temperature (PVT) and may be more pronounced at millimeter wave (mmWave) frequencies used in fifth generation (5G) communications and other technologies. The phase offset introduces an error in the power measurement. To address this, the power detector 120 may include a phase shifter to cancel out the phase offset between the voltage sensor and the current sensor. However, calibrating the phase shifter across PVT is challenging particularly at mmWave frequencies. In addition, the sensing coil used in the current sensor to sense the current can be bulky and sensitive to impedance terminations resulting in inaccuracies in the power measurement.

Aspects of the present disclosure provide power detectors that measure the power delivered to an antenna using a resistive element coupled between the power amplifier and the antenna as a power sensor. In certain aspects, the power detector senses the voltages at both terminals (i.e., ends) of the resistive element, squares each of the sensed voltages, and computes a difference between the squared voltages to measure the power delivered to the antenna. Thus, aspects of the present disclosure measure the power delivered to the antenna by sensing the voltages at both terminals of the resistive element. As a result, aspects of the present disclosure avoid the need for a phase shifter to cancel out the phase offset between a voltage sensor and a current sensor (e.g., current sensing coil), which can be challenging across PVT particularly at mmWave frequencies. Also, aspects of the present disclosure avoid the need of using a current sensing coil to sense current, which can be bulky and sensitive to impedance terminations that result in power measurement inaccuracies.

Figure 2:
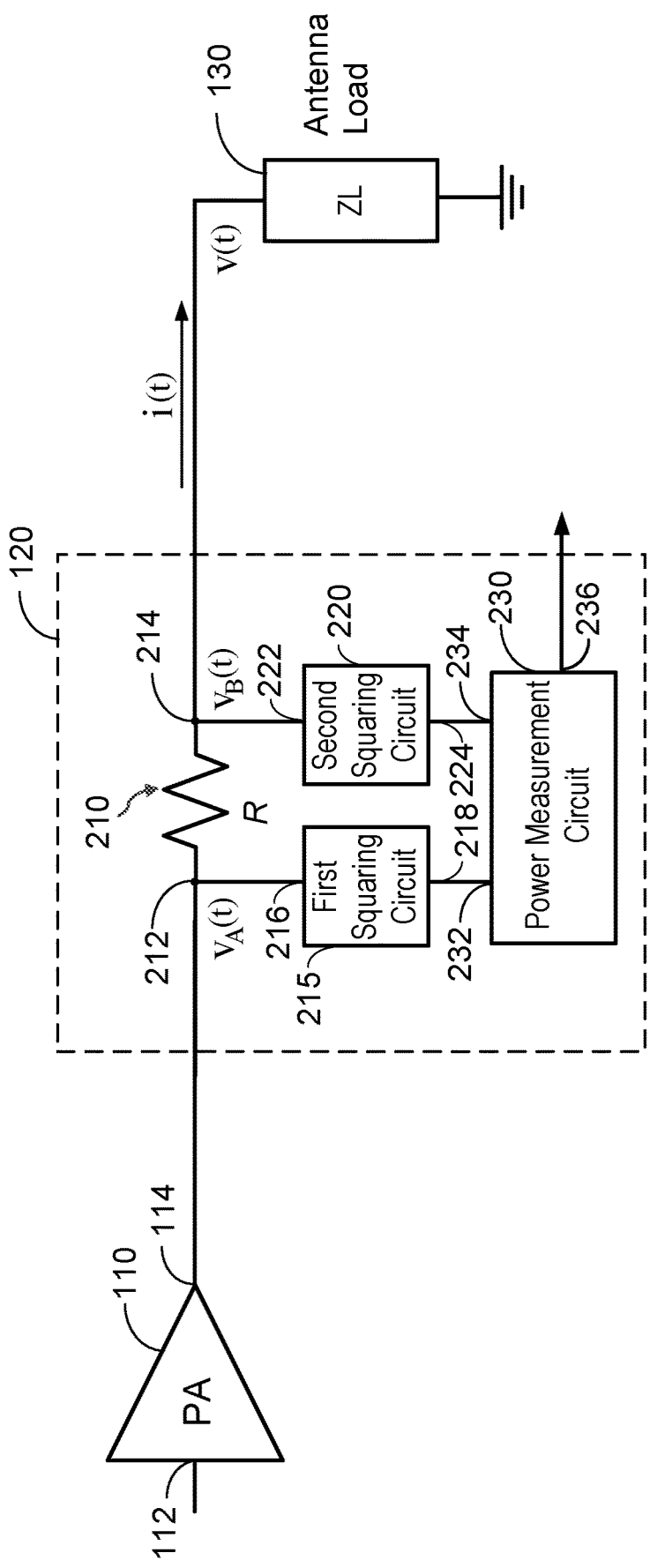
FIG. 2 shows an exemplary power detector including squaring circuits according to certain aspects of the present disclosure.

FIG. 2 shows an exemplary implementation of the power detector 120 according to aspects of the present disclosure. The power detector 120 may be configured to measure the instantaneous power and/or average power delivered to the antenna 130. The power delivered to the antenna 130 is given by the product of the voltage and current of the antenna 130 as follows:

$$P(t)=v(t) \cdot i(t) \quad (1)$$

where P(t) is the power delivered to the antenna 130, v(t) is the voltage across the antenna 130, and i(t) is the current through the antenna 130. The average power delivered to the antenna 130 is given by:

$$P_{avg}=\overline{v(t) \cdot i(t)} \quad (2)$$

where $P_{avg}$ is the average power, and the bar on top represents time averaging.

For the case where the voltage v(t) is a sinusoidal, the voltage (t) may be given by:

$$v(t)=V \cos(\omega_{RF} t) \quad (3)$$

where V is the amplitude of the voltage v(t) and ORF is the angular frequency of the voltage v(t). In this example, the current i(t) through the antenna 130 is given by:

$$i(t)=I \cos(\omega_{RF} t+\theta) \quad (4)$$

where I is the amplitude of the current i(t) and θ is the phase angle between the voltage v(t) and the current i(t). The phase angle θ comes from the fact that the impedance of the antenna 130 may be complex. For the case of a purely resistive load, the phase angle θ is zero. In this example, the instantaneous power may be determined by plugging the expressions for the voltage v(t) and the current i(t) given in equations (3) and (4), respectively, into equation (1), which results in the following:

$$p(t) = \frac{IV}{2}(\cos(\theta) + \cos(2\omega_{RF}t + \theta)). \quad (5)$$

As shown in equation (5), the instantaneous power includes a first term and a second term, in which the first term is given by $$\frac{IV}{2}(\cos(\theta))$$

and the second term is a second harmonic term given by $$\frac{IV}{2}\cos(2\omega_{RF}t + \theta).$$

The first term provides the average power delivered to the antenna 130. Thus, the average power delivered to the antenna 130 may be determined by removing the second harmonic term in equation (5) using low pass filtering, resulting in the following expression for the average power:

$$P_{avg} = \frac{IV}{2}(\cos(\theta)). \quad (6)$$

In the example in FIG. 2, the power detector 120 includes a resistive element 210, a first squaring circuit 215, a second squaring circuit 220, and a power measurement circuit 230. The resistive element 210 (also referred to as a lossy element) is coupled between the power amplifier 110 and the antenna 130. The resistive element 210 is coupled in series with the antenna 130 so that the current flowing through the antenna 130 also flows through the resistive element 210. In certain aspects, the resistive element 210 has a very low resistance (e.g., a few ohms) so that the power loss from the resistive element 210 is very small. The resistive element 210 may be implemented with a low-resistance resistor (e.g., a metal line resistor). In some implementations, the resistive element 210 may be implemented with a power switch, in which the on resistance of the power switch provides the resistance of the resistive element 210, as discussed further below.

The resistive element 210 has a first terminal 212 coupled to the power amplifier 110 and a second terminal 214 coupled to the antenna 130. The first and second terminals 212 and 214 may also be referred to as the two ends of the resistive element 210. The voltage at the first terminal 212 is labeled $v_A(t)$ and the voltage at the second terminal 214 is labeled $v_B(t)$. As discussed further below, the first terminal 212 of the resistive element 210 may be coupled to the power amplifier 110 via a transformer (e.g., balun) in some implementations. Also, the second terminal 214 of the resistive element 210 may be coupled to the antenna 130 via a transmission line in some implementations.

The first terminal 212 of the resistive element 210 is coupled to an input 216 of the first squaring circuit 215, and the second terminal 214 of the resistive element 210 is coupled to an input 222 of the second squaring circuit 220. The first squaring circuit 215 is configured to generate a first signal at the output 218 of the first squaring circuit 215 that is proportional to the square of the voltage at the input 216 of the first squaring circuit 215. Since the input 216 of the first squaring circuit 215 is coupled to the first terminal 212 of the resistive element 210, the first signal is proportional to the square of the voltage at the first terminal 212. The second squaring circuit 220 is configured to generate a second signal at the output 224 of the second squaring circuit 220 that is proportional to the square of the voltage at the input 222 of the second squaring circuit 220. Since the input 222 of the second squaring circuit 220 is coupled to the second terminal 214 of the resistive element 210, the second signal is proportional to the square of the voltage at the second terminal 214. Each of the first and second signals may be a voltage or a current. The output 218 of the first squaring circuit 215 is coupled to a first input 232 of the power measurement circuit 230, and the output 224 of the second squaring circuit 220 is coupled to a second input 234 of the power measurement circuit 230.

The power measurement circuit 230 is configured to generate a power measurement signal based on the difference between the first signal and the second signal, as discussed further below. The power measurement signal may be input to the power control circuit 150 (shown in FIG. 1) to control the output power of the power amplifier 110 based on the measured power, as discussed above.

Assuming the current through the resistive element 210 is equal to or sufficiently close to the current through the antenna 130 and assuming the voltage at the second terminal 214 of the resistive element 210 is equal to the voltage across the antenna 130, the current through the antenna 130 may be given by:

$$i(t) = \frac{v_A(t) - v_B(t)}{R} = \frac{v_A(t) - v(t)}{R} \quad (7)$$

where R is the resistance of the resistive element 210. Equation (7) also gives the current through the resistive element 210 since the resistive element 210 is in series with the antenna 130. In this example, the voltage at the first terminal 212 of the resistive element 210 is related to the current through the antenna 130 and the voltage across the antenna 130 by the following:

$$v_A(t) = i(t) \cdot R + v(t) \quad (8)$$

where i(t)·R is the voltage drop across the resistive element 210 from the current passing through the resistive element 210. The square of the voltage at the first terminal 212 of the resistive element 210 is given by:

$$v_A^2(t) = i^2(t) \cdot R^2 + 2v(t)i(t)R + v^2(t) \quad (9)$$

which is obtained by squaring equation (8).

Assuming the voltage at the second terminal 214 of the resistive element 210 is equal to the voltage across the antenna 130, the difference between the square of the voltage at the first terminal 212 and the square of the voltage at the second terminal 214 is given by:

$$v_A^2(t) - v_B^2(t) = i^2(t) \cdot R^2 + 2v(t)i(t)R \quad (10).$$

Since the resistance of the resistive element 210 is very low, the term with the resistance squared in equation (10) is very small and can therefore be neglected resulting in the following:

$$v_A^2(t) - v_B^2(t) = 2v(t)i(t)R \qquad (11).$$

As shown in equation (11), the difference between the square of the voltage at the first terminal 212 and the square of the voltage at the second terminal 214 is proportional to the power delivered to the antenna 130 (i.e., v(t)·i(t)) by a proportionality factor of 2R. Thus, the difference between the square of the voltage at the first terminal 212 and the square of the voltage at the second terminal 214 can be used to provide a measurement of the power delivered to the antenna 130, as discussed further below.

As discussed above, the first squaring circuit 215 outputs a first signal that is proportional to the square of the voltage at the first terminal 212, and the second squaring circuit 220 outputs a second signal that is proportional to the square of the voltage at the second terminal 214. The power measurement circuit 230 may generate a power measurement signal that is proportional to the difference between the first signal from the first squaring circuit 215 and the second signal from the second squaring circuit 220. Since the first signal is proportional to the square of the voltage at the first terminal 212 (i.e., $V_A^2(t)$) and the second signal is proportional to the square of the voltage at the second terminal 214 (i.e., $V_B^2(t)$), the power measurement signal (which is proportional to the difference between the first signal and the second signal) is proportional to the difference between square of the voltage at the first terminal 212 and the square of the voltage at the second terminal 214. Since the difference between the square of the voltage at the first terminal 212 and the square of the voltage at the second terminal 214 is proportional to the power delivered to the antenna 130 (e.g., based on equation (11) above), the power measurement signal is also proportional to the power delivered to the antenna 130, and therefore provides a measurement of the power delivered to the antenna 130.

The power measurement circuit 230 may output the power measurement signal at the output 236 or perform additional processing on the power measurement signal (e.g., low pass filtering to measure average power) before outputting the power measurement signal at the output 236. The output 236 may be coupled to the power control circuit 150 (shown in FIG. 1) to provide the power measurement signal to the power control circuit 150.

In one example, the first squaring circuit 215 may be implemented with a first multiplier that squares the voltage at the input 216 of the first squaring circuit 215 by multiplying the voltage at the input 216 with itself. In this example, the first signal may be proportional to the square of the voltage at the input 216 by a proportionality factor of G, which may be the gain of the multiplier. The second squaring circuit 220 may be implemented with a second multiplier that squares the voltage at the input 222 of the second squaring circuit 220 by multiplying the voltage at the input 222 with itself. In this example, the second signal may be proportional to the square of the voltage at the input 222 by a proportionality factor of G. The proportionality factor G may be less than one, equal to one, or greater than one.

In one example, the first signal is a first current that is proportional to the square of the voltage at the input 216 of the first squaring circuit 215 and the second signal is a second current that is proportional to the square of the voltage at the input 222 of the second squaring circuit 220. In this example, each of the squaring circuits 215 and 220 may be implemented with a respective transistor configured to generate the respective current based on a square law relationship between the current (e.g., drain current) of the transistor and the gate voltage of the transistor, as discussed further below.

Figure 3:
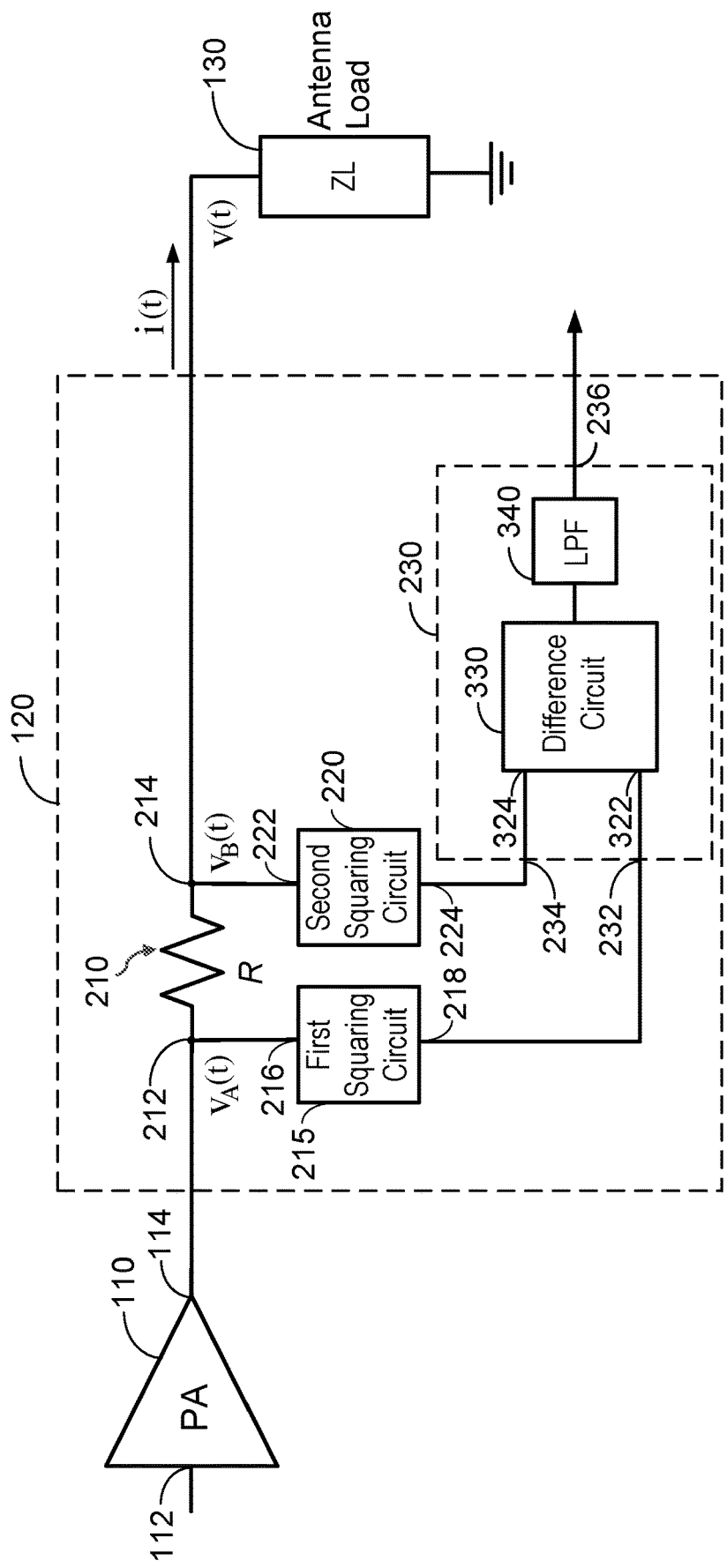
FIG. 3 shows an exemplary implementation of a power measurement circuit according to certain aspects of the present disclosure.

FIG. 3 shows an exemplary implementation of the power measurement circuit 230 according to certain aspects. In this example, the power measurement circuit 230 includes a difference circuit 330 and a low pass filter 340. The difference circuit 330 has a first input 322 coupled to the output 218 of the first squaring circuit 215 and a second input 324 coupled to the output 224 of the second squaring circuit 220. The low pass filter 340 is coupled to the output of the difference circuit 330.

In this example, the difference circuit 330 receives the first signal from the first squaring circuit 215 and the second signal from the second squaring circuit 220, and generates an output signal based on the difference between the first signal and the second signal. Since the difference between the first signal and the second signal is proportional to the power delivered to the antenna 130 (e.g., based on equation (11)), the output signal of the difference circuit 330 provides a measurement of the power delivered to the antenna 130. In one example, the output signal of the difference circuit 330 is proportional to the difference between the first signal and the second signal, and therefore proportional to the power delivered to the antenna 130. In this example, the difference circuit 330 may be implemented with a differential amplifier in which the output signal is proportional to the difference between the first signal and the second signal by the gain of the differential amplifier.

The output signal of the difference circuit 330 is then time averaged by the low pass filter 340 to generate a filtered output signal that is proportional to an average power delivered to the antenna 130, and therefore provides a measurement of the average power delivered to the antenna 130. For example, the low pass filter 340 may be configured to filter out the second harmonic term shown in equation (5) from the output signal so that the filtered output signal provides a measurement of the average power delivered to the antenna 130. The low pass filter 340 may be configured to filter out the second harmonic term by setting the cutoff frequency of the low pass filter 340 below the second harmonic frequency.

Thus, in this example, the filtered output signal provides a measurement of the average power delivered to the antenna 130 and is output at the output 236 of the power measurement circuit 230 as a power measurement signal. The low pass filter 340 may be implemented with a resistor capacitor (RC) low pass filter, or another type of low pass filter.

Figure 4:
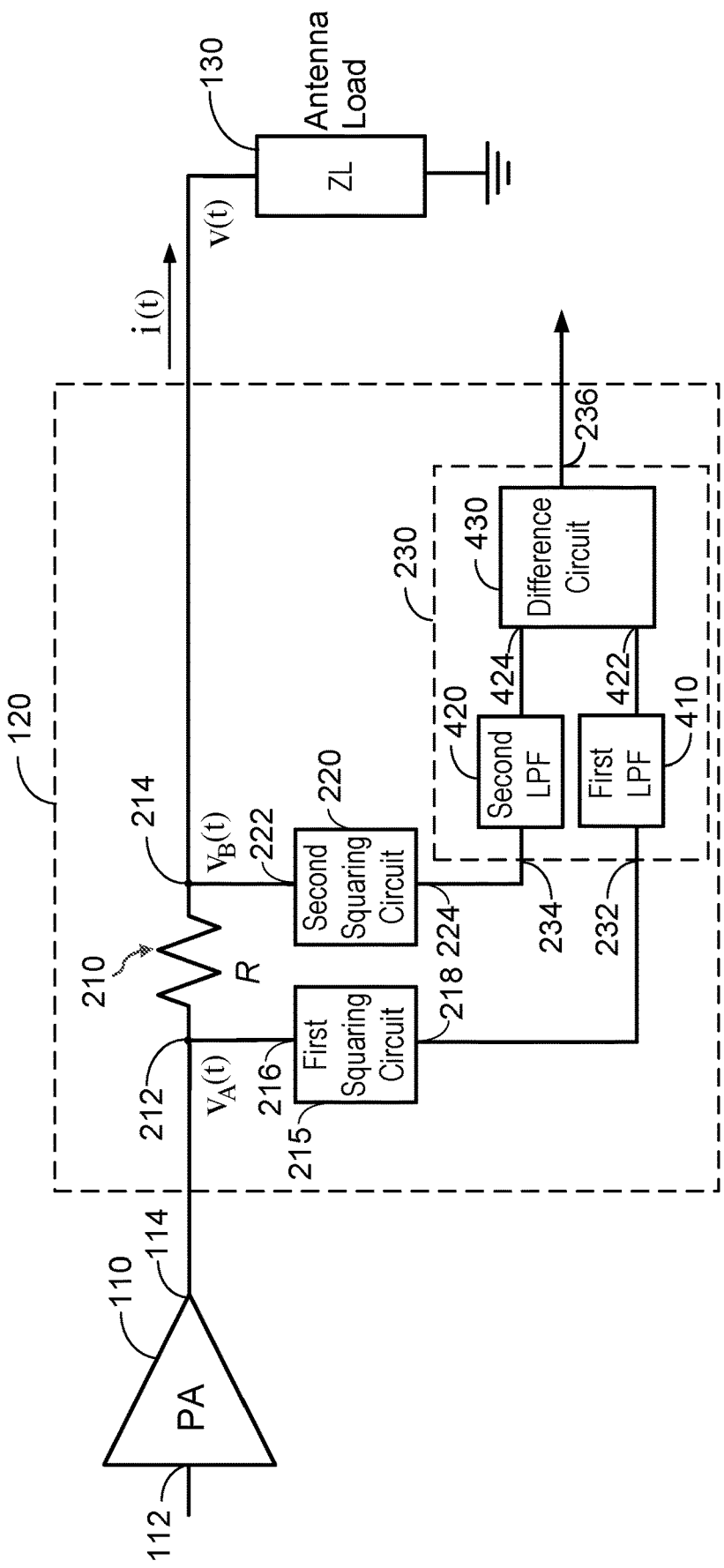
FIG. 4 shows another exemplary implementation of a power measurement circuit according to certain aspects of the present disclosure.

FIG. 4 shows another exemplary implementation of the power measurement circuit 230 according to certain aspects. In this example, the power measurement circuit 230 includes a first low pass filter 410, a second low pass filter 420, and a difference circuit 430. The first low pass filter 410 is coupled between the output 218 of the first squaring circuit 215 and a first input 422 of the difference circuit 430, and the second low pass filter 420 is coupled between the output 224 of the second squaring circuit 220 and a second input 424 of the difference circuit 430.

In this example, the first squaring circuit 215 generates the first signal which is proportional to the square of the voltage at the first terminal 212 of the resistive element 210. The first low pass filter 410 time averages the first signal to generate a filtered first signal that is proportional to the time average of the square of the voltage at the first terminal 212 of the resistive element 210 (e.g., square of the root-mean-square of the voltage at the first terminal 212). In one example, the first signal includes a first term proportional to the time average of the square of the voltage at the first terminal 212 of the resistive element 210 and a second harmonic term generated by the squaring operation of the first squaring circuit 215. In this example, the first low pass filter 410 may be configured to filter out the second harmonic so that the filtered first signal is proportional to the time average of the square of the voltage at the first terminal 212 of the resistive element 210.

The second squaring circuit 220 generates the second signal which is proportional to the square of the voltage at the second terminal 214 of the resistive element 210. The second low pass filter 420 time averages the second signal to generate a filtered second signal that is proportional to the time average of the square of the voltage at the second terminal 214 of the resistive element 210 (e.g., square of the root-mean-square of the voltage at the second terminal 214). In one example, the second signal includes a first term proportional to the time average of the square of the voltage at the second terminal 214 of the resistive element 210 and a second harmonic term generated by the squaring operation of the second squaring circuit 220. In this example, the second low pass filter 420 may be configured to filter out the second harmonic term so that the filtered second signal is proportional to the time average of the square of the voltage at the second terminal 214 of the resistive element 210.

In this example, the difference circuit 430 receives the filtered first signal from the first low pass filter 410 and the filtered second signal from the second low pass filter 420, and generates a measurement signal based on the difference between the filtered first signal and the filtered second signal. Since the filtered first signal is proportional to the time average of the square of the voltage at the first terminal 212 and the filtered second signal is proportional to the time average of the square of the voltage at the second terminal 214, the measurement signal provides a measurement of the average power delivered to the antenna 130. The difference circuit 30 may output the measurement signal at the output 236 of power measurement circuit.

In one example, the difference circuit 430 is implemented with a digital circuit that computes the difference between the filtered first signal and the filtered second signal in the digital domain to generate the measurement signal. In this example, the filtered first signal and the filtered second signal may be digitized by one or more analog-to-digital converters (not shown in FIG. 4) before being input to the difference circuit 430.

Figure 5:
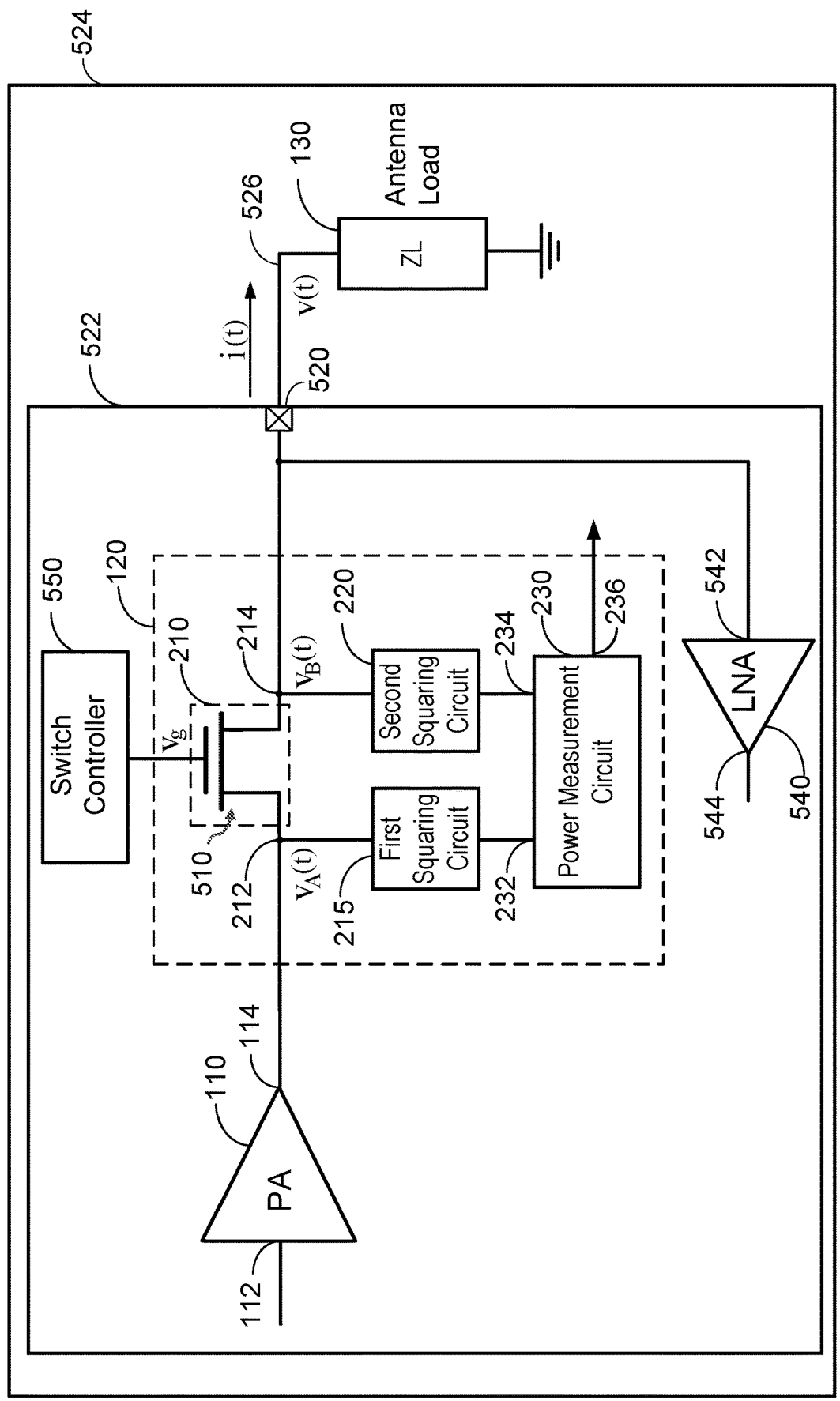
FIG. 5 shows an exemplary power detector in which a power switch is used as a power sensor according to certain aspects of the present disclosure.

FIG. 5 shows an example in which the resistive element 210 is implemented with a power switch 510 according to certain aspects. In this example, the power switch 510 is coupled between the power amplifier 110 and the antenna 130, and the on resistance of the power switch 510 provides the resistance of the resistive element 210 to measure the power delivered to the antenna 130. The on resistance is the resistance of the power switch 510 when the power switch 510 is turned on. An advantage of using the power switch 510 for the resistive element 210 is that the power switch 510 may already be in the transmit path between the power amplifier 110 and the antenna 130, and therefore does not require that an additional resistive element be placed in the transmit path to measure power. Also, the power switch 510 has a well-defined on resistance making it suitable for power measurement.

In this example, the antenna 130 is shared by the transmitter and a receiver using time division duplexing (TDD) in which signals are transmitted and received via the antenna 130 in different time slots. The receiver includes a low noise amplifier (LNA) 540 configured to amplify an RF signal received at input 542 via the antenna 130, and output the amplified RF signal at output 544 for further processing (e.g., frequency down conversion).

The transmitter and the receiver may be coupled to the antenna 130 via an output pin 520. In the example in FIG. 5, the power switch 510 is coupled between the power amplifier 110 and the output pin 520, and the input 542 of the LNA 540 is coupled to the output pin 520. The output pin 520 may be coupled to the antenna 130 via a transmission line.

In certain aspects, the transmitter, the receiver, and the output pin 520 may be integrated on a chip 522, and the antenna 130 may be external to the chip 522 (i.e., the antenna 130 may be off chip). In these aspects, the chip 522 and the antenna 130 may be mounted on a substrate 524 (e.g., a printed circuit board), in which the output pin 520 is coupled to the antenna 130 via a transmission line 526 (e.g., one or more metal lines) on the substrate 524.

In this example, the on/off state of the power switch 510 is controlled by a switch controller 550. In a transmit mode, the switch controller 550 turns on (i.e., closes) the power switch 510 to couple the power amplifier 110 to the antenna 130 via the power switch 510. In this mode, the on resistance of the power switch 510 provides the resistance of the resistive element 210 for measuring the power delivered to the antenna 130, as discussed above.

In a receive mode, the switch controller 550 turns off (i.e., opens) the power switch 510, which decouples the power amplifier 110 from the antenna 130. This is done to isolate the LNA 540 from loading from the power amplifier 110.

In the example in FIG. 5, the power switch 510 is implemented with an n-type field effect transistor (NFET). In this example, the switch controller 550 controls the on/off state of the power switch 510 by controlling the gate voltage (labeled "Vg") of the NFET. In the receive mode, the switch controller 550 may apply approximately zero volts to the gate of the NFET to turn off the power switch 510. In the transmit mode, the switch controller 550 may apply a high voltage to the gate of the NFET to turn on the power switch 510. In this mode, the switch controller 550 may make adjustments to the gate voltage to maintain the on resistance of the power switch 510 at an approximately constant resistance across PVT.

Figure 6:
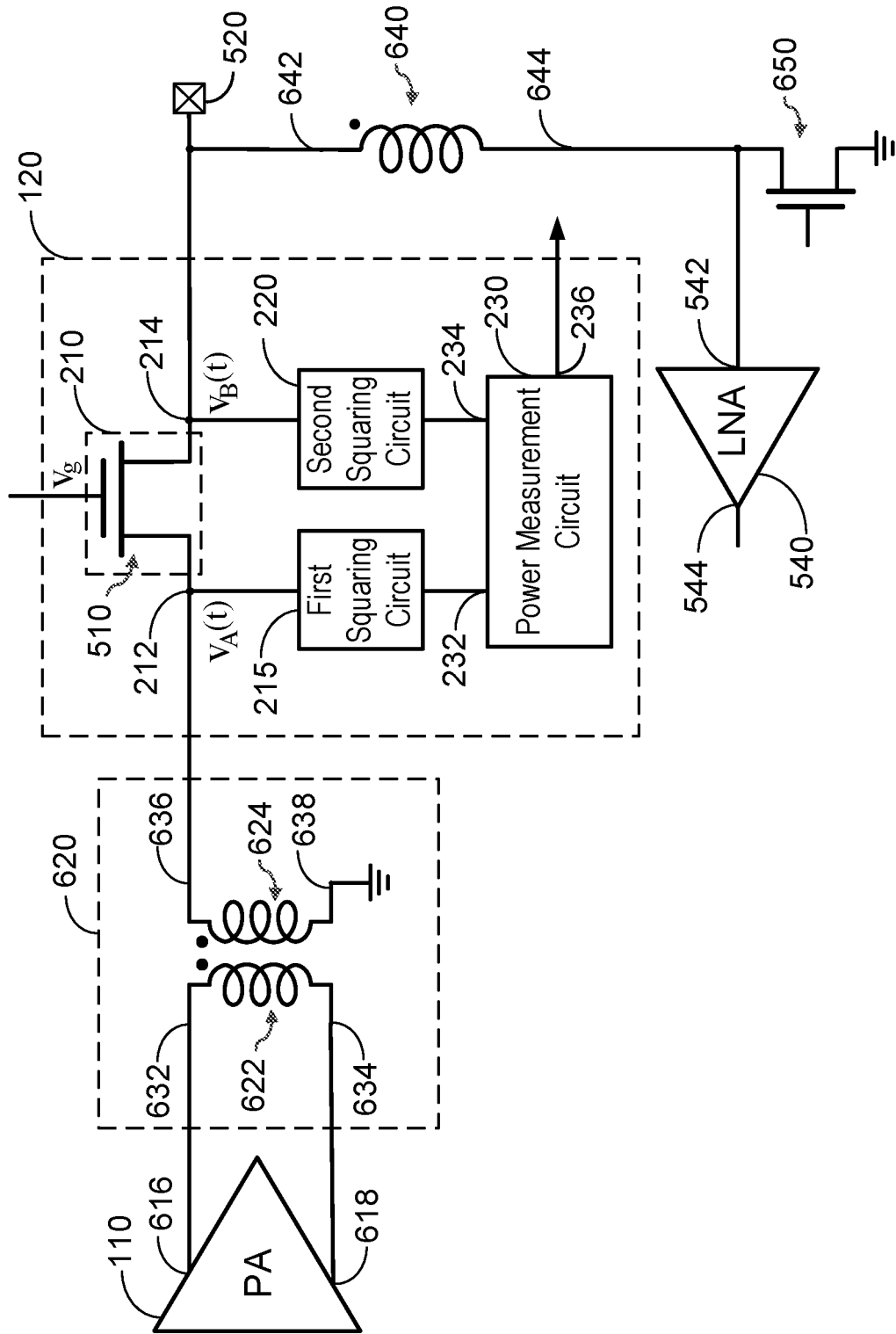
FIG. 6 shows an example of a transformer coupled between a power amplifier and a power switch according to certain aspects of the present disclosure.

FIG. 6 shows an example in which the power amplifier 110 is coupled to the resistive element 210 via a transformer 620. In this example, the power amplifier 110 is a differential power amplifier 110 configured to output a differential RF signal at a differential output including a first output 616 and a second output 618. The transformer 620 includes a first inductor 622 (e.g., primary inductor) and a second inductor 624 (e.g., secondary inductor), in which the second inductor 624 is magnetically coupled with the first inductor 622. Each of the inductors 622 and 624 may be implemented with a coil inductor, spiral inductor, slab inductor, or another type of inductor.

In this example, the first inductor 622 of the transformer 620 is coupled between the first output 616 and the second output 618 of the power amplifier 110. More particularly, a first terminal 632 of the first inductor 622 is coupled to the first output 616 of the power amplifier 110, and a second terminal 634 of the first inductor 622 is coupled to the second output 618 of the power amplifier 110. The second inductor 624 of the transformer 610 is coupled between the resistive element 210 (e.g., the power switch 510) and ground. More particularly, a first terminal 636 of the second inductor 624 is coupled to the first terminal 212 of the resistive element 210 (e.g., the power switch 510), and a second terminal 638 of the second inductor 624 is coupled to ground.

In this example, the transformer 620 is configured to convert the differential RF signal at the first inductor 622 from the power amplifier 110 into a single-ended RF signal at the second inductor 624, which is output to the antenna 130 (shown in FIG. 5) through the resistive element 210 (e.g., the power switch 510). In this example, the transformer 610 may also be referred to as a balun. The transformer 610 may also be used to provide impedance matching between the differential output of the power amplifier 110 and the antenna 130, as discussed further below.

The receiver includes an inductor 640 coupled between the output pin 520 and the input 542 of the LNA 540. A first terminal 642 of the inductor 640 is coupled to the output pin 520, and a second terminal 644 of the inductor 640 is coupled to the input 542 of the LNA 540. The inductor 640 is used to provide impedance matching between the antenna 130 (shown in FIG. 5) and the input 542 of the LNA 540. The receiver also includes a pull-down switch 650 coupled between the input 542 of the LNA 540 and ground. The pull-down switch 650 is also coupled between the second terminal 644 of the inductor 640 and ground. In the example shown in FIG. 6, the pull-down switch 650 is implemented with an NFET. However, it is to be appreciated that the pull-down switch 650 may be implemented with a different type of transistor. The switch controller 550 (shown in FIG. 5) may control the on/off state of the pull-down switch 650, as discussed further below.

For the example in which the resistive element 210 is implemented with the power switch 510, the switch controller 550 turns on the power switch 510 and turns on the pull-down switch 650 in the transmit mode. In this mode, the power switch 510 couples the transformer 620 to the antenna 130 (shown in FIG. 5). Also, the pull-down switch 650 couples the input 542 of the LNA 540 to ground. This protects the input 542 of the LNA 540 from potential damage due to a large transmit RF signal in the transmit mode. The pull-down switch 650 also couples the second terminal 644 of the inductor 640 to ground. Thus, in the transmit mode, the inductor 640 is coupled between the output pin 520 and ground. In this example, the transformer 620 in combination with the inductor 640 provides impedance matching between the differential output of the power amplifier 110 and the antenna 130.

In the transmit mode, the power amplifier 110 outputs a differential RF signal to the transformer 610. The transformer 620 converts the differential RF signal into a single-ended RF signal, which is output to the antenna 130 via the power switch 510. In addition, the power switch 510 is used as the power sensor in the power detector 120 for measuring the power delivered to the antenna 130, as discussed above.

In the receive mode, the switch controller 550 turns off the power switch 510 and turns off the pull-down switch 650. In this mode, the power switch 510 decouples the transformer 620 from the antenna 130, which isolates the input 542 of the LNA 540 from loading from the transformer 620. This isolation prevents loading from the transformer 620 from degrading the the noise figure of the LNA 540.

In the receive mode, the antenna 130 receives an RF signal from another wireless device (not shown). The received RF signal is sent to the input 542 of the LNA 540 via the inductor 640. The LNA 540 amplifies the received RF signal, and outputs the amplified RF signal at the output 544 for further processing. For example, the output 544 may be coupled to a frequency down converter (not shown) configured to down convert the frequency of the amplified RF signal from RF to baseband or an intermediate frequency.

In certain aspects, it may be desirable to provide the transmitter and the receiver with electrostatic discharge (ESD) protection. An ESD event may occur when charge is unintentionally deposited on the output pin 520. The charge may build up on the output pin 520 causing a large potential to appear on the output pin 520, which can damage the LNA 540 and/or another device (not shown) coupled to the output pin 520. In order to protect against an ESD event, it is desirable to provide a discharge path from the output pin 520 to ground to safely discharge the charge from the output pin 520.

Figure 7:
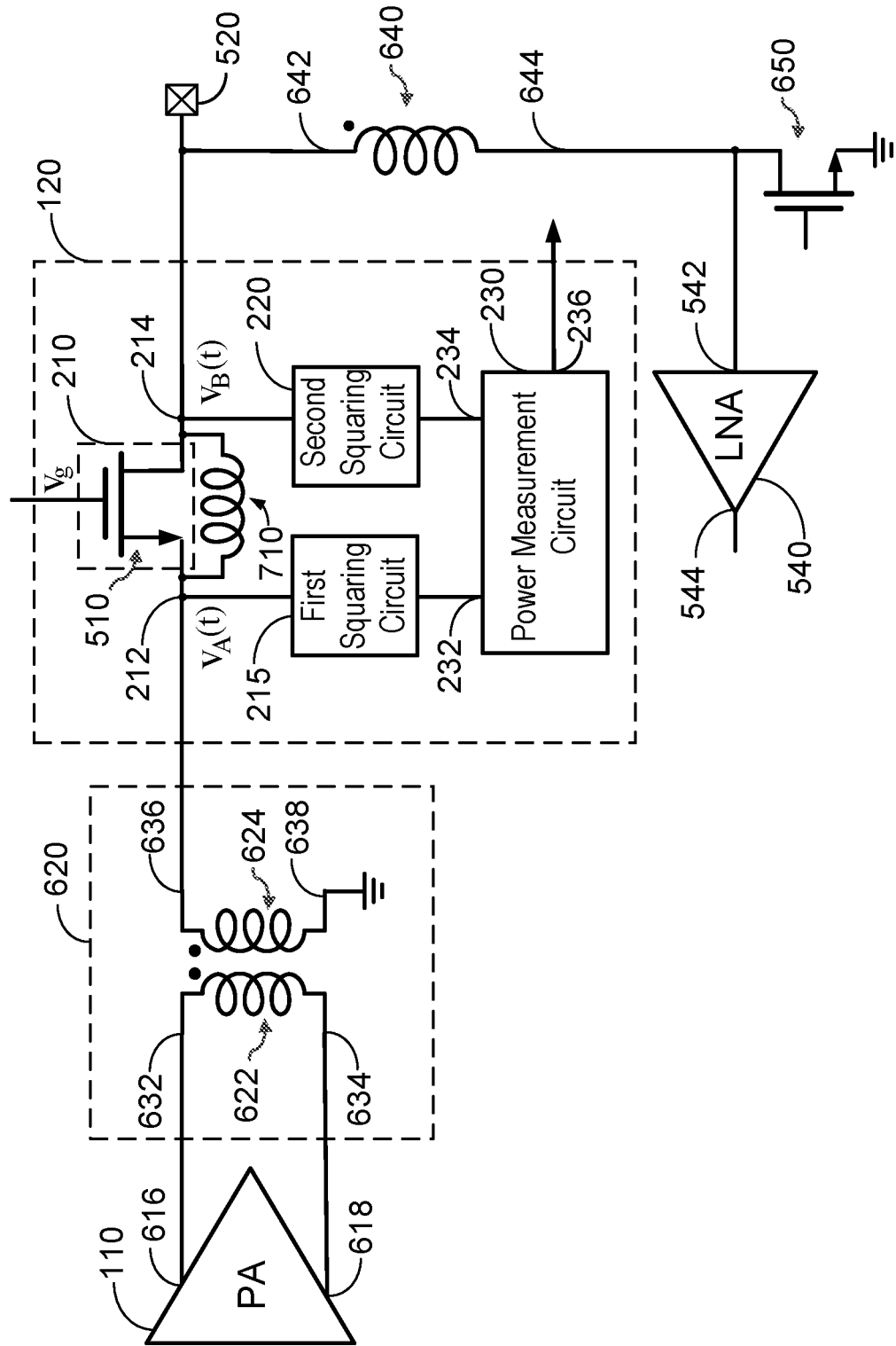
FIG. 7 shows an example of a shunt inductor coupled in parallel with a power switch according to certain aspects of the present disclosure.

To provide a discharge path from the output pin 520 to ground to provide ESD protection, a shunt inductor 710 may be coupled in parallel with the power switch 510, an example of which is shown in FIG. 7. In this example, the shunt inductor 710 is coupled in series with the second inductor 624 of the transformer 620. During an ESD event, the shunt inductor 710 and the second inductor 624 of the transformer 620 provide a discharge path from the output pin 520 to ground to safely discharge charge on the output pin 520.

When the power switch 510 is turned off, the shunt inductor 710 is coupled in parallel with the off capacitance of the power switch 510, forming an LC network. In one example, the inductance of the shunt inductor 710 may be chosen such that the LC network resonates at a frequency (e.g., center frequency) of the RF signal received by the LNA 540 in the receive mode. As a result, the LC network appears as an open circuit in the receive mode, which helps isolate the input 542 of the LNA 540 from loading from the transformer 620. As discussed above, loading from the transformer 620 may degrade the noise figure of the LNA 540 if the LNA 540 is not isolated from the transformer 620 in the receive mode.

Figure 8:
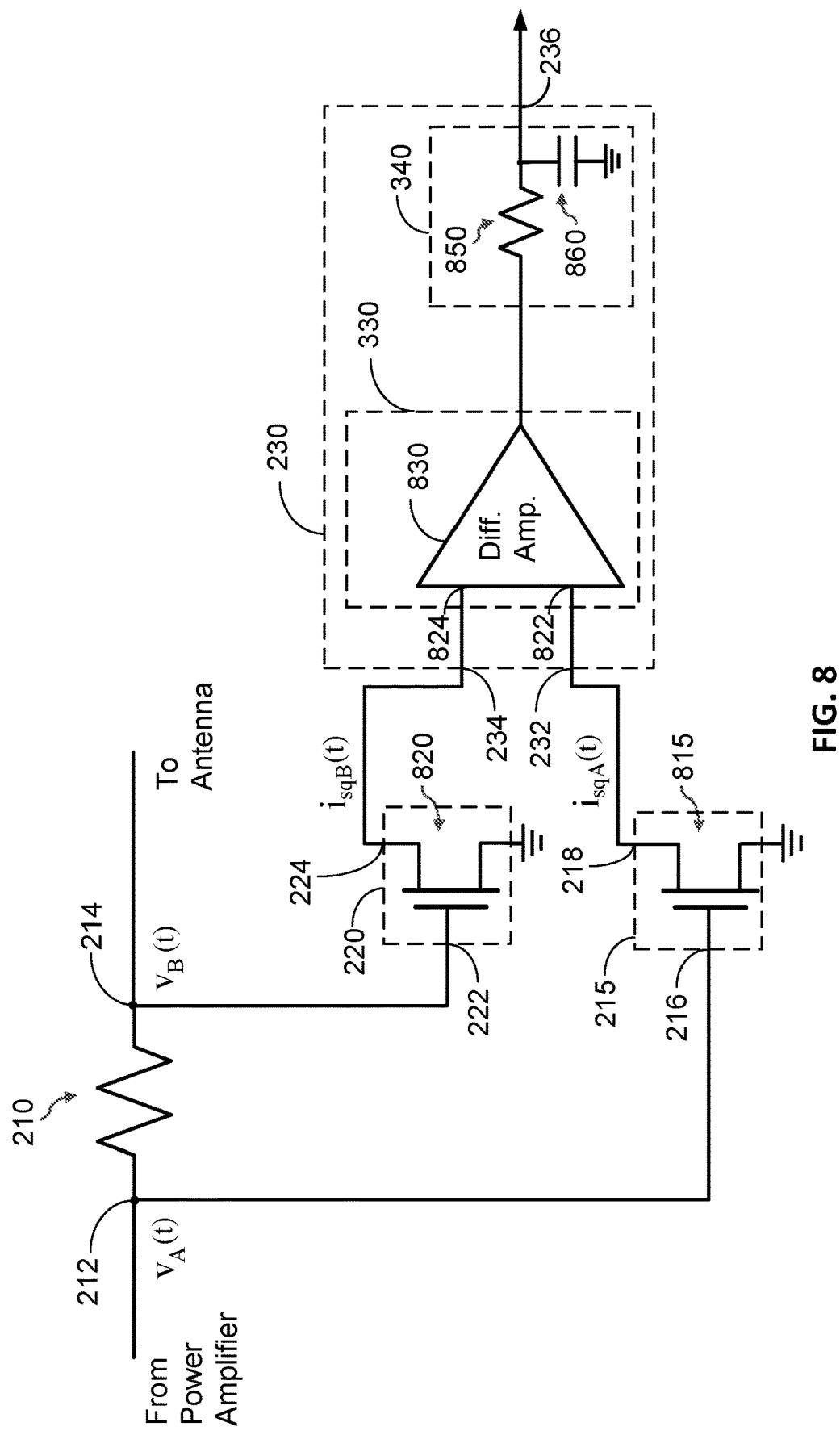
FIG. 8 shows an example of squaring circuits implemented with transistors according to certain aspects of the present disclosure.

FIG. 8 shows an exemplary implementation of the first and second squaring circuits 215 and 220, the difference circuit 330 and the low pass filter 340 in FIG. 3 according to certain aspects. In this example, the first squaring circuit 215 comprises a first transistor 815, in which the gate of the first transistor 815 is coupled to the first terminal 212 of the resistive element 210 (e.g., the power switch 510). The first transistor 815 is configured to generate a first current (labeled "$i_{sqA}(t)$") that is proportional to the square of the voltage at the gate of the first transistor 815 based on a square law relationship between the current (e.g., drain current) of the first transistor 815 and the gate voltage of the first transistor 815. Since the gate of the first transistor 815 is coupled to the first terminal 212 of the resistive element 210, the first current is proportional to the square of the voltage at the first terminal 212 of the resistive element 210. The resistive element 210 may be implemented with the power switch 510 in some implementations.

The second squaring circuit 220 comprises a second transistor 820, in which the gate of the second transistor 820 is coupled to the second terminal 214 of the resistive element 210 (e.g., power switch 510). The second transistor 820 is configured to generate a second current (labeled "$i_{sqB}(t)$") that is proportional to the square of the voltage at the gate of the second transistor 820 based on a square law relationship between the current (e.g., drain current) of the second transistor 820 and the gate voltage of the second transistor 820. Since the gate of the second transistor 820 is coupled to the second terminal 214 of the resistive element 210, the second current is proportional to the square of the voltage at the second terminal 214 of the resistive element 210.

It is to be appreciated that the power detector 120 may also include a bias circuit (not shown) for biasing the gates of the first and second transistors 815 and 820. In the example in FIG. 8, the first transistor 815 is implemented with a first NFET having a drain coupled to the first input 232 of the power measurement circuit 230 and a source coupled to ground, and the second transistor 820 is implemented with a second NFET having a drain coupled to the second input 234 of the power measurement circuit 230 and a source coupled to ground. However, it is to be appreciated that the first and second transistors 815 and 820 may be implemented with other types of transistors.

In this example, the difference circuit 330 comprises a differential amplifier 830 with a first input 822 coupled to the drain of the first transistor 815, a second input 824 coupled to the drain of the second transistor 820, and an output coupled to the low pass filter 340. The differential amplifier 830 is configured to generate an output signal proportional to a difference between the first current from the first transistor 815 and the second current from the second transistor 820. Since the first current is proportional to the square of the voltage at the first terminal 212 of the resistive element 210 and the second current is proportional to the square of the voltage at the second terminal 214 of the resistive element 210, the output signal of the amplifier 830 is proportional to the power delivered to the antenna 130. In one example, the differential amplifier 830 is implemented with a transimpedance differential amplifier in which the output signal of the amplifier 830 is a voltage.

The output signal of the amplifier 830 is time averaged by the low pass filter 340 to generate a filtered output signal that is proportional to an average power delivered to the antenna 130. For example, the low pass filter 340 may be configured to filter out the second harmonic term in equation (5) discussed above so that the filtered output signal is proportional to the average power delivered to the antenna 130. In this example, the filtered output signal provides a measurement of the average power delivered to the antenna 130 and is output at the output 236 of the power measurement circuit 230 as a power measurement signal. In the example shown in FIG. 8, the low pass filter 340 is implemented with a resistor capacitor (RC) low pass filter comprising a resistor 850 coupled between the output of the amplifier 830 and the output 236 of the power measurement circuit 230, and a capacitor 860 coupled between the output 236 of the power measurement circuit 230 and ground. It is to be appreciated that the low pass filter 340 is not limited to an RC filter and may be implemented with another type of low pass filter.

It is to be appreciated that the differential amplifier 830 is not limited to the example where the first signal and the second signal are currents. The differential amplifier 830 may also be used in implementations where the first signal and the second signal are voltages. In general, the first input 822 of the differential amplifier 830 is coupled to the output 218 of the first squaring circuit 215, the second input 824 of the differential amplifier 830 is coupled to the output 224 of the second squaring circuit 220, and the differential amplifier 830 generates an output signal proportional to the difference between the first signal and the second signal. The output signal may be a voltage or a current.

The difference between the voltage at the first terminal 212 (i.e., $v_A(t)$) of the resistive element 210 and the voltage at the second terminal 214 (i.e., $v_B(t)$) of the resistive element 210 may be referred to as a differential mode voltage, which correlates with the current through the antenna 130. The average value of $v_A(t)$ and $v_B(t)$ may be referred to as a common mode voltage and may be given by:

$$\text{Common mode voltage} = \frac{v_A(t) + v_B(t)}{2}. \quad (12)$$

The common mode voltage correlates with the voltage across the antenna 130. Both the differential mode voltage and the common mode voltage may be needed to accurately measure the power delivered to the antenna 130.

During transmission, the voltage at the first terminal 212 (i.e., $v_A(t)$) and the voltage at the second terminal 214 (i.e., $v_B(t)$) may be relatively large (e.g., one or more volts) while the difference between these voltage (i.e., $v_A(t)-v_B(t)$) may be very small due to the small resistance of the resistive element 210. As a result, the differential mode voltage may be much smaller than the common mode voltage, which may make it difficult for the squaring circuits 215 and 220 to sense the differential mode voltage, decreasing the accuracy of the power measurement. For example, the differential mode voltage may be on the order of tens of millivolts while the common mode voltage may be one or more volts. To alleviate this, the common mode voltage may be reduced relative to the differential mode to improve sensitivity to the differential mode voltage at the squaring circuits 215 and 220. This may be accomplished using a transformer configured to retain the differential mode while reducing the common mode voltage, as discussed further below.

Figure 9:
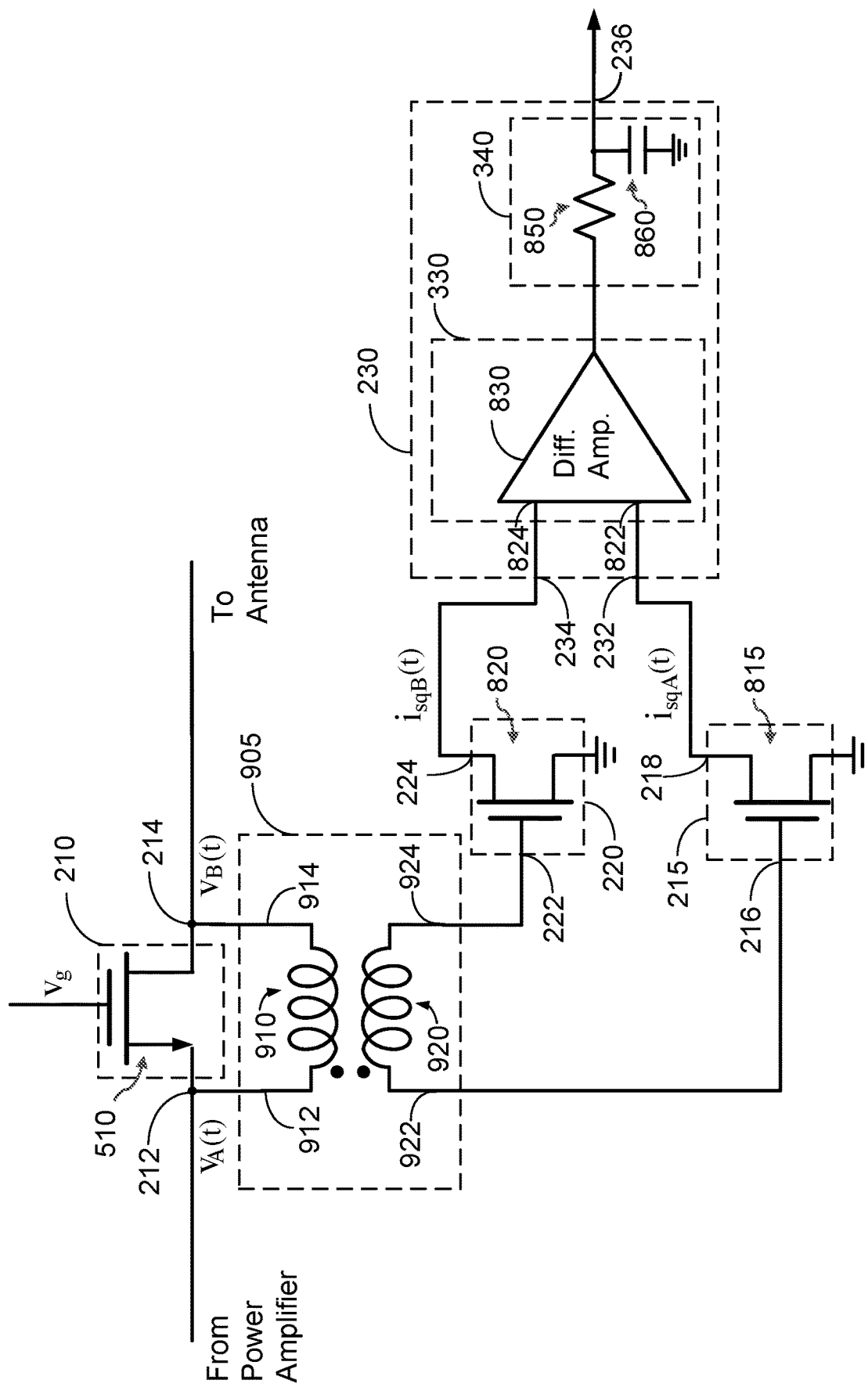
FIG. 9 shows an example of a transformer coupled between a power switch and squaring circuits according to certain aspects of the present disclosure.

FIG. 9 shows an example of a transformer 905 coupled between the resistive element 210 (e.g., the power switch 510) and the squaring circuit 215 and 220 according to certain aspects. The transformer 905 is configured to retain the differential mode voltage across the resistive element 210 while reducing the common mode voltage to improve the sensitivity to the differential mode voltage at the squaring circuits 215 and 220.

The transformer 905 includes a first inductor 910 (e.g., primary inductor) and a second inductor 920 (e.g., secondary inductor), in which the second inductor 920 is magnetically coupled with the first inductor 910. Each of the inductors 910 and 920 may be implemented with a coil inductor, spiral inductor, slab inductor, or another type of inductor.

In this example, the first inductor 910 of the transformer 905 is coupled in parallel with the resistive element 210 (e.g., power switch 510). More particularly, a first terminal 912 of the first inductor 910 is coupled to the first terminal 212 of the resistive element 210, and a second terminal 914 of the first inductor 910 is coupled to the second terminal 214 of the resistive element 210. For the example in which the resistive element 210 is implemented with the power switch 510, the first inductor 910 of the transformer 905 may also function as a shunt inductor to provide ESD protection since the first inductor 910 is coupled in parallel with the power switch 510 in this example. In this case, the first inductor 910 may replace the shunt inductor 710 in FIG. 7.

The second inductor 920 is coupled between the inputs of the squaring circuits 215 and 220. More particularly, a first terminal 922 of the second inductor 920 is coupled to the input 216 of the first squaring circuit 215, and a second terminal 924 of the second inductor 920 is coupled to the input 222 of the second squaring circuit 220. For the example in which the first squaring circuit 215 comprises the first transistor 815 and the second squaring circuit 220 comprises the second transistor 820, the first terminal 922 of the second inductor 920 is coupled to the gate of the first transistor 815 and the second terminal 924 of the second inductor 920 is coupled to the gate of the second transistor 820.

In this example, the transformer 905 retains the differential mode voltage across the resistive element 210. As a result, the differential mode voltage applied to the inputs of the squaring circuit 215 and 220 is approximately the same as the differential mode voltage across the resistive element 210. The transformer 905 reduces the common mode voltage such that the common mode voltage at the squaring circuits 215 and 220 is related to the common mode voltage at the resistive element 210 by the following:

$$\frac{v'_A(t) + v'_B(t)}{2} = \frac{v_A(t) + v_B(t)}{2} \cdot \left(\frac{C_T}{C_M}\right) \quad (13)$$

where $v'_A(t)$ is the voltage at the input 216 of the first squaring circuit 215, $v'_B(t)$ is the voltage at the input 222 of the second squaring circuit 220, $C_T$ is the capacitance between the first inductor 910 and the second inductor 920, and $C_M$ is the capacitance at the inputs 216 and 222 of the squaring circuits 215 and 220. As shown in equation (13), the transformer 905 reduces the common mode voltage by a ratio of $C_T/C_M$. Thus, the reduction in the common mode voltage may be set to a desired amount by designing the capacitance $C_T$ between the first inductor 910 and the second inductor 920 accordingly. Design parameters for setting the capacitance $C_T$ may include spacing between the inductors 910 and 920, dielectric material between the inductors 910 and 920, overlap between the inductors 910 and 920, and/or one or more other parameters. In some implementations, the capacitance $C_T$ may be designed to reduce common mode voltage by a factor or ten or more (i.e., reduce the common mode voltage at the squaring circuits 215 and 220 to one tenth or less of the common mode voltage at the resistive element 210).

Reducing the common mode voltage relative to the differential mode voltage advantageously increases the sensitivity of the squaring circuits 215 and 220 to the differential mode voltage, which improves the accuracy of the power measurement. Reducing the common mode voltage also allows the squaring circuits 215 and 220 to be implemented with lower voltage devices (e.g., low voltage transistors), which may reduce the power and/or size of the squaring circuits 215 and 220.

During transmission, the voltage at the first terminal 212 (i.e., $v_A(t)$) of the resistive element 210 and the voltage at the second terminal 214 (i.e., $v_B(t)$) of the resistive element 210 may be relatively large (e.g., one or more volts). In this case, the voltages at the terminals 212 and 214 of the resistive element 210 may be scaled down before inputting the voltages to the squaring circuits 215 and 220. Scaling down the voltages allows the squaring circuits 215 and 220 to be implemented with low voltage devices (e.g., low voltage transistors) to reduce the power and/or size of the squaring circuits 215 and 220.

Figure 10:
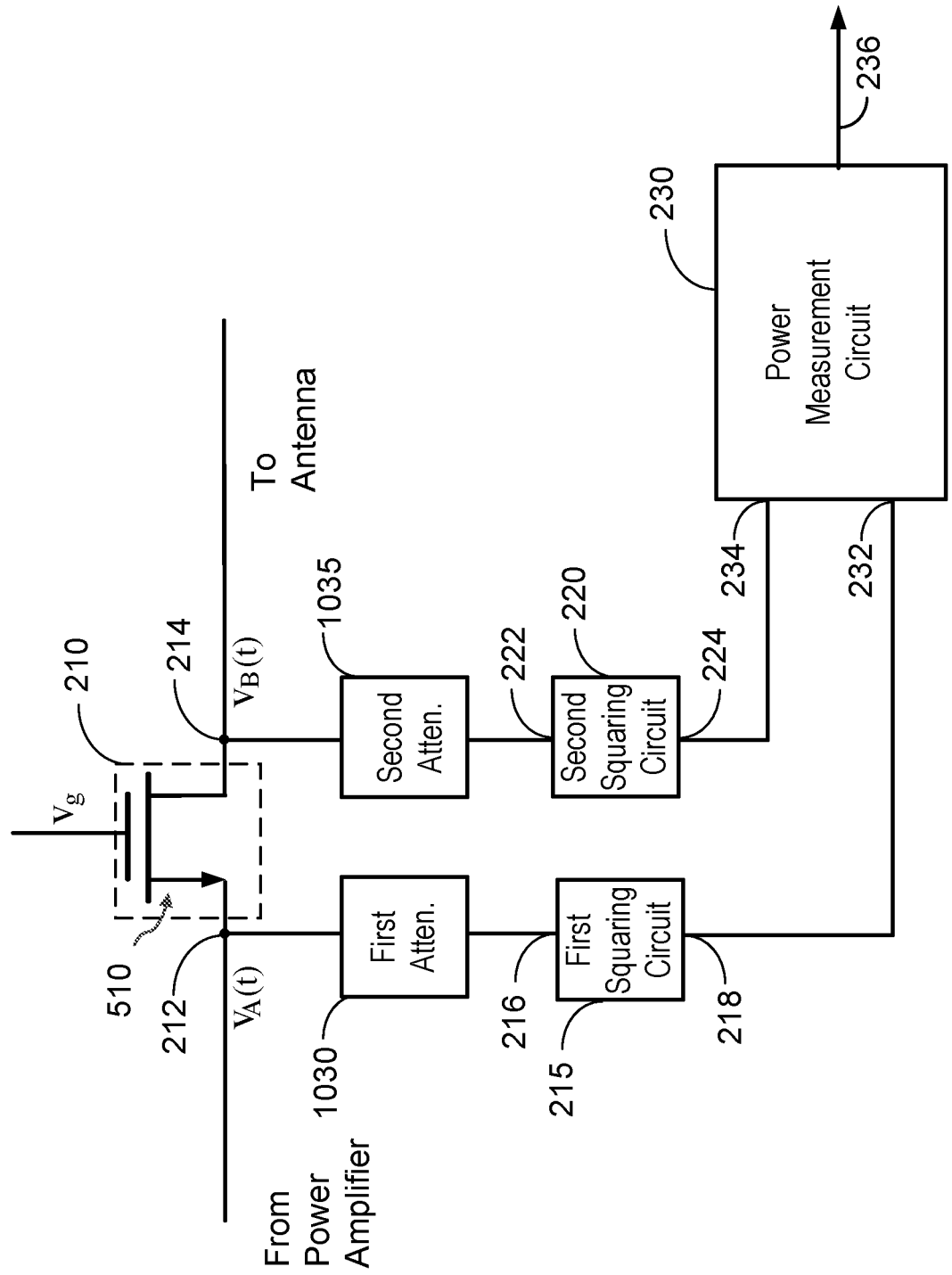
FIG. 10 shows an example of a power detector including attenuators according to certain aspects of the present disclosure.

In this regard, FIG. 10 shows an example in which the power detector 120 includes a first attenuator 1030 coupled between the first terminal 212 of the resistive element 210 and the input 216 of the first squaring circuit 215, and a second attenuator 1035 coupled between the second terminal 214 of the resistive element 210 and the input 222 of the second squaring circuit 220. The first attenuator 1030 is configured to scale down the voltage at the first terminal 212 by an attenuation factor of a and output the attenuated voltage to the input 216 of the first squaring circuit 215. Similarly, the second attenuator 1035 is configured to scale down the voltage at the second terminal 214 by an attenuation factor of a and output the attenuated voltage to the input 222 of the second squaring circuit 220. In this example, the first attenuator 1030 inputs a voltage of $\alpha v_A(t)$ to the input 216 of the first squaring circuit 215 and the second attenuator 1035 inputs a voltage of $\alpha v_B(t)$ to the input 222 of the second squaring circuit 220.

Figure 11:
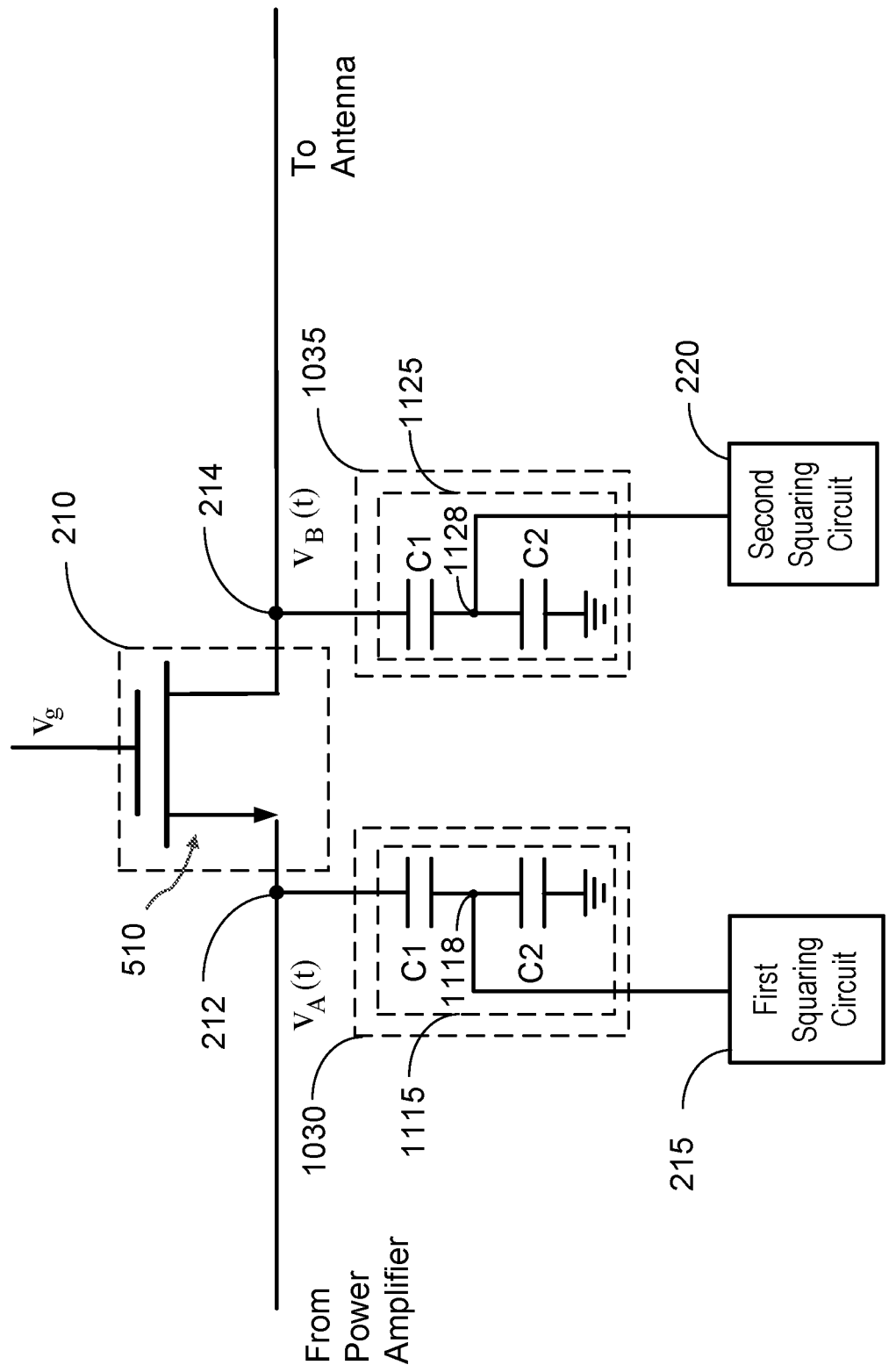
FIG. 11 shows an example of attenuators implemented with capacitive voltage dividers according to certain aspects of the present disclosure.

FIG. 11 shows an exemplary implementation of the first attenuator 1030 and the second attenuator 1035 according to certain aspects. Note that the power measurement circuit 230 is not shown in FIG. 11. In this example, the first attenuator 1030 comprises a first capacitive voltage divider 1115 and the second attenuator 1035 comprises a second capacitive voltage divider 1125. Each of the capacitive voltage dividers 1115 and 1125 includes a first capacitor C1 and a second capacitor C2 coupled in series between the respective terminal of the resistive element 210 and ground. The output 1118 of the first attenuator 1030 is taken at a node between the respective first capacitor C1 and the respective second capacitor C2, and the output 1128 of the second attenuator 1035 is taken at a node between the respective first capacitor C1 and the respective second capacitor C2, as shown in FIG. 11. In this example, the attenuation factor $\alpha$ of each of the attenuators 1030 and 1035 is given by:

$$\alpha = \frac{C1}{C1 + C2 + Cin} \quad (14)$$

where C1 in equation (14) is the capacitance of the respective first capacitor C1, C2 in equation (14) is the capacitance of the respective second capacitor C2, and Cin is the input capacitance of the input of the respective one of the squaring circuits 215 and 220. An advantage of implementing the first and second attenuators 1030 and 1035 with the first and second capacitive voltage dividers 1115 and 1125, respectively, is that the capacitive voltage dividers 1115 and 1125 may have small loads (e.g., by making the capacitance of C1 small), and therefore help reduce loading on the terminals 212 and 214 of the resistive element 210 (e.g., the power switch 510).

In certain aspects, the first capacitor C1 and/or the second capacitor C2 in each attenuator 1030 and 1035 may have programmable capacitances. This enables the attenuator factor $\alpha$ of each attenuator 1030 and 1035 to be programmed by programming the capacitance of the respective first capacitor C1 and/or the capacitance of the respective second capacitor C2 according to a desired attenuation factor (e.g., based on equation (14)). In one example, the programmable attenuation factor $\alpha$ may be used to extend the dynamic power range of the power detector 120. In this example, the attenuation factor $\alpha$ may be increased for larger voltages at the terminals 212 and 214 of the resistive element 210 to provide more attenuation for larger voltages, and the attenuation factor $\alpha$ may be decreased for smaller voltages at the terminals 212 and 214 of the resistive element 210 to provide less attenuation for smaller voltages.

Figure 12:
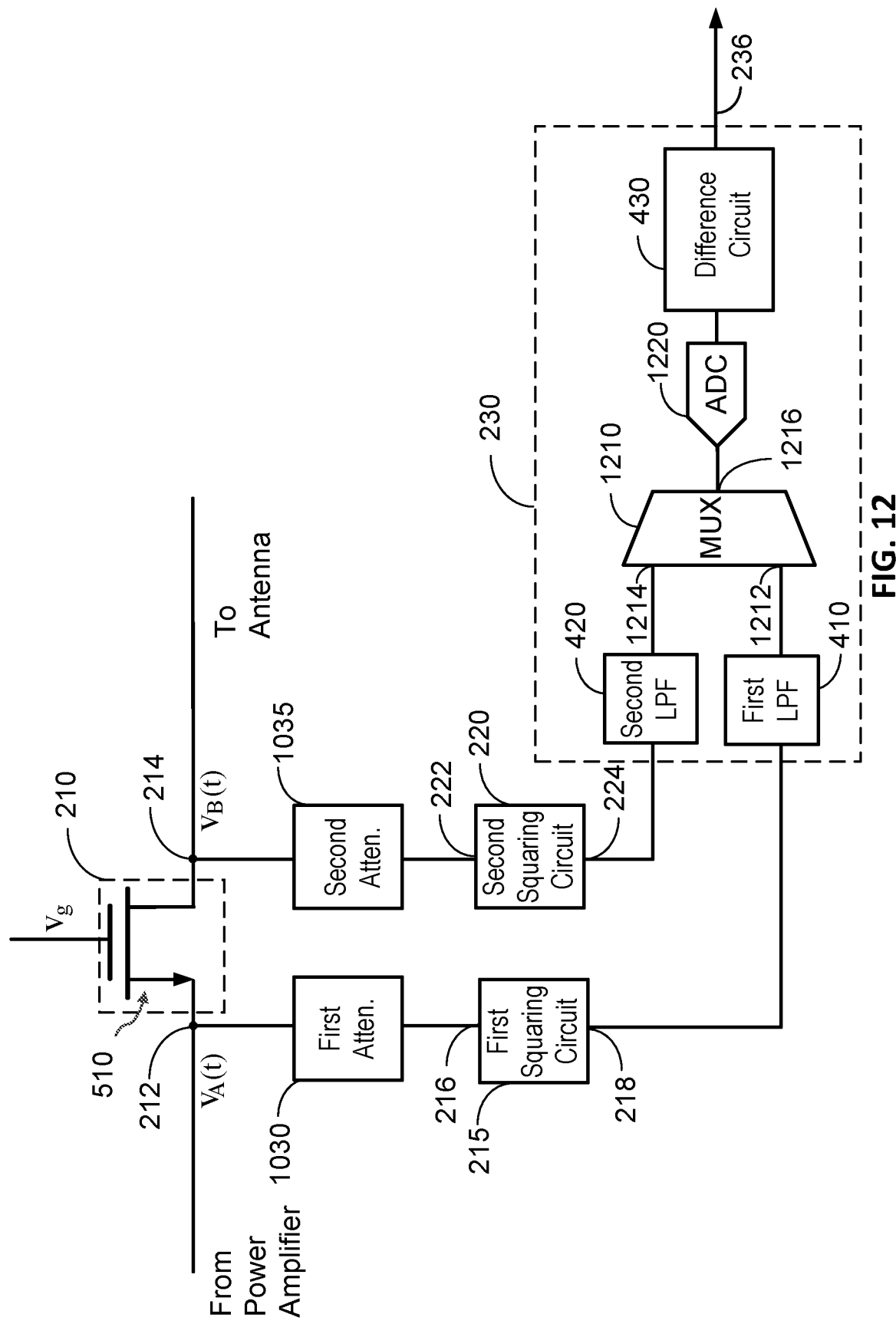
FIG. 12 shows an example of a power detector including a multiplexer according to certain aspects of the present disclosure.

FIG. 12 shows an exemplary implementation of the power measurement circuit 230 according to certain aspects. In this example, the power measurement circuit 230 includes the first low pass filter 410, the second low pass filter 420, and the difference circuit 430 discussed above with reference to FIG. 4. The power measurement circuit 230 also includes a multiplexer 1210 and an analog-to-digital converter (ADC) 1220. Also, in this example, the power detector 120 includes the first and second attenuators 1030 and 1035 discussed above.

The multiplexer 1210 includes a first input 1212 coupled to the output of the first low pass filter 410, a second input 1214 coupled to the output of the second low pass filter 420, and an output 1216 coupled to the input of the ADC 1220. The output of the ADC 1220 is coupled to the difference circuit 430. The multiplexer 1210 is configured to couple the outputs of the low pass filters 410 and 420 to the input of the ADC 1220 one at a time, as discussed further below.

In this example, the first attenuator 1030 attenuates the voltage at the first terminal 212 of the resistive element 210 by the attenuation factor $\alpha$ and outputs the attenuated voltage to the first squaring circuit 215. The first squaring circuit 215 then generates a first signal that is proportional to the square of the voltage at the first terminal 212 of the resistive element 210 by a proportionality factor of $\alpha^2 G$, where G is the gain of the first squaring circuit 215. The first low pass filter 410 generates a filtered first signal that is proportional to the square of the root-mean-square of the voltage at the first terminal 212 (e.g., by filtering out the second harmonic discussed above). The filtered first signal may be given by $\alpha^2 G v_{A\_rms}^2$, where $v_{A\_rms}$ is the root-mean-square of the voltage at the first terminal 212. The filtered first signal is input to the first input 1212 of the multiplexer 1210.

The second attenuator 1035 attenuates the voltage at the second terminal 214 of the resistive element 210 by the attenuation factor $\alpha$ and outputs the attenuated voltage to the second squaring circuit 220. The second squaring circuit 220 then generates a second signal that is proportional to the square of the voltage at the second terminal 214 of the resistive element 210 by a proportionality factor of $\alpha^2 G$, where G is the gain of the second squaring circuit 220. The second low pass filter 420 generates a filtered second signal that is proportional to the square of the root-mean-square of the voltage at the second terminal 214 (e.g., by filtering out the second harmonic discussed above). The filtered second signal may be given by $\alpha^2 G v_{B\_rms}^2$, where $v_{B\_rms}$ is the root-mean-square of the voltage at the second terminal 214. The filtered second signal is input to the second input 1214 of the multiplexer 1210.

The multiplexer 1210 inputs the filtered first signal and the filtered second signal to the ADC 1220 one at a time. The ADC 1220 digitizes each of the filtered first signal and the filtered second signal one at a time, and outputs the digital version of the filtered first signal (i.e., first digital signal) and the digital version of the filtered second signal (i.e., second digital signal) to the difference circuit 430. The difference circuit 430 may then compute the difference between the filtered first signal and the filtered second signal in the digital domain, in which the difference provides a measurement of the average power delivered to the antenna 130. The difference circuit 430 may output the computed difference at output 236 as a digital power measurement signal.

Figure 13:
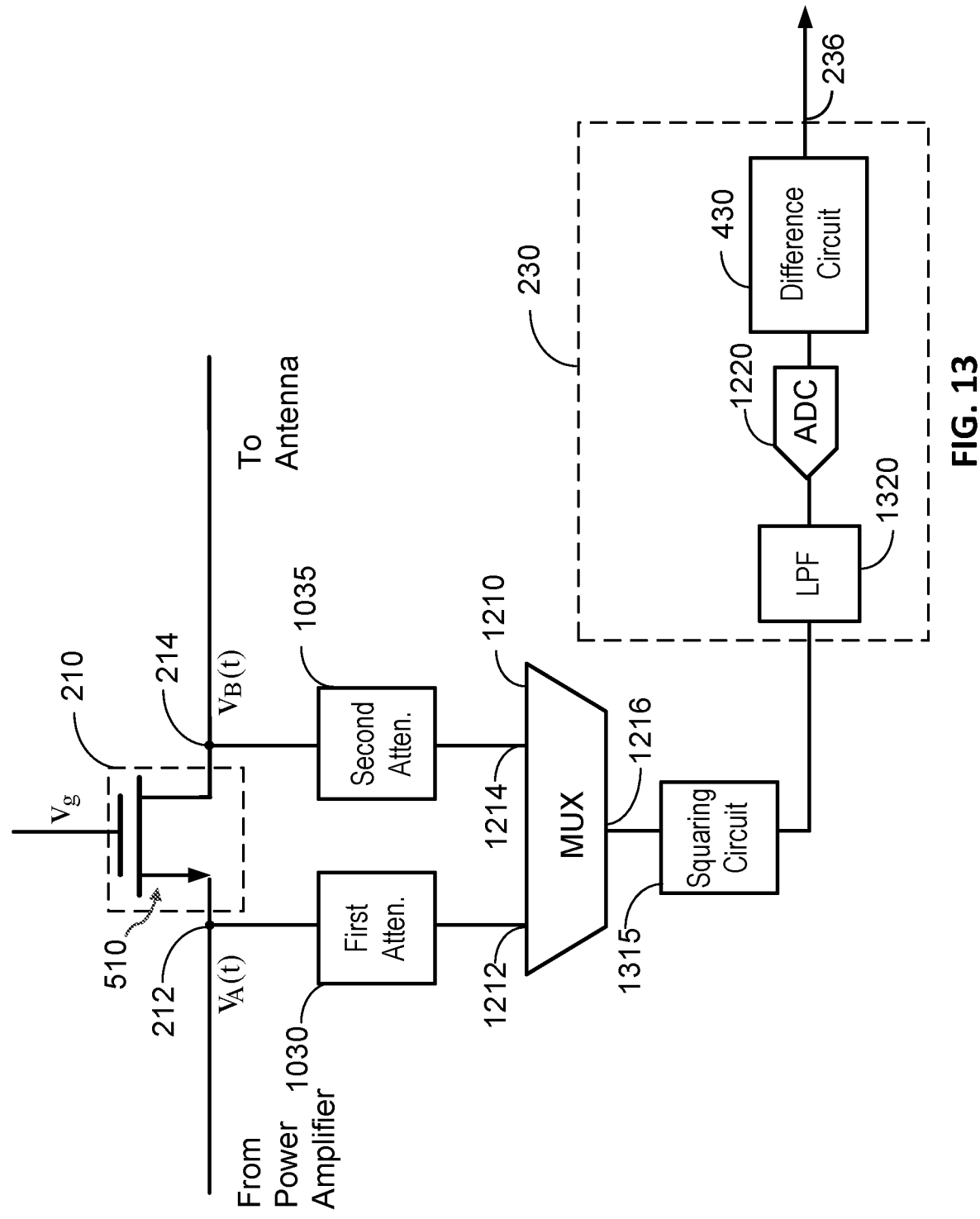
FIG. 13 shows another example of a power detector including a multiplexer according to certain aspects of the present disclosure.

FIG. 13 shows an example in which the multiplexer 1210 in the power detector 120 is moved closer to the resistive element 210 relative to the position of the multiplexer 1210 in FIG. 12 according to certain aspects. In this example, the power detector 120 may include one squaring circuit 1315 instead of two squaring circuits and one low pass filter 1320 instead of two low pass filters.

The output of the first attenuator 1030 is coupled to the first input 1212 of the multiplexer 1210 and the output of the second attenuator 1035 is coupled to the second input 1214 of the multiplexer 1210. The output 1216 of the multiplexer 1210 is coupled to the input of the squaring circuit 1315. The output of the squaring circuit 1315 is coupled to the input of the low pass filter 1320 and the output of the low pass filter 1320 is coupled to the input of the ADC 1220. The output of the ADC 1220 is coupled to the input of the difference circuit 430.

In this example, the first attenuator 1030 attenuates the voltage at the first terminal 212 of the resistive element 210 by the attenuation factor $\alpha$ and outputs the attenuated voltage to the first input 1212 of the multiplexer 1210. The second attenuator 1035 attenuates the voltage at the second terminal 214 of the resistive element 210 by the attenuation factor $\alpha$ and outputs the attenuated voltage to the second input 1214 of the multiplexer 1210. The multiplexer 1210 outputs the attenuated voltage from the first attenuator 1030 and the attenuated voltage from the second attenuator 1035 to the squaring circuit 1315 one at a time.

When the multiplexer 1210 outputs the attenuated voltage from the first attenuator 1030 to the squaring circuit 1315, the squaring circuit 1315 generates a first signal that is proportional to the square of the voltage at the first terminal 212 of the resistive element 210 by a proportionality factor of $\alpha^2 G$, where G is the gain of the squaring circuit 1315. The low pass filter 1320 then generates a filtered first signal that is proportional to the square of the root-mean-square of the voltage at the first terminal 212. The ADC 1220 digitizes the filtered first signal and outputs the digital version of the filtered first signal (i.e., first digital signal) to the difference circuit 430.

When the multiplexer 1210 outputs the attenuated voltage from the second attenuator 1035 to the squaring circuit 1315, the squaring circuit 1315 generates a second signal that is proportional to the square of the voltage at the second terminal 214 of the resistive element 210 by a proportionality factor of $\alpha^2 G$. The low pass filter 1320 generates a filtered second signal that is proportional to the square of the root-mean-square of the voltage at the second terminal 214. The ADC 1220 digitizes the filtered second signal and outputs the digital version of the filtered second signal (i.e., second digital signal) to the difference circuit 430.

The difference circuit 430 may then compute the difference between the filtered first signal and the filtered second signal in the digital domain, in which the difference provides a measurement of the average power delivered to the antenna 130. The difference circuit 430 may output the computed difference at output 236 as a digital power measurement signal.

Thus, in this example, one squaring circuit 1315 and one low pass filter 1320 are used to measure power instead of two squaring and two low pass filters. An advantage of this implementation is that the use of one squaring circuit 1315 and one low pass filter 1320 may help reduce error in the power measurement due to mismatch between two squaring circuits and mismatch between two low pass filters.

Figure 14:
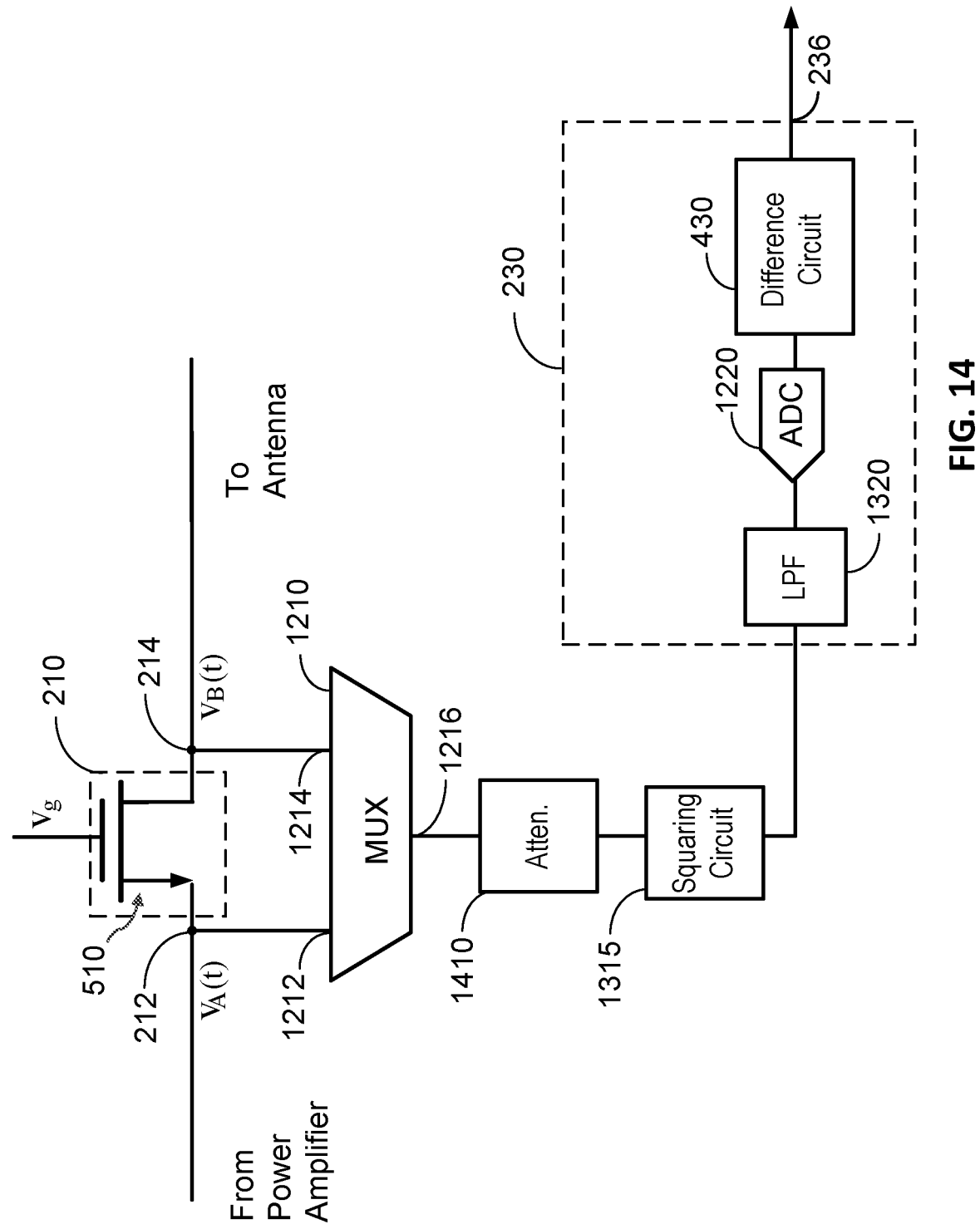
FIG. 14 shows yet another example of a power detector including a multiplexer according to certain aspects of the present disclosure.

FIG. 14 shows an example in which the multiplexer 1210 in the power detector 120 is moved closer to the resistive element 210 relative to the position of the multiplexer 1210 in FIG. 13 according to certain aspects. In this example, the power detector 120 includes one attenuator 1410, one squaring circuit 1315 and one low pass filter 1320.

In this example, the first terminal 212 of the resistive element 210 is coupled to the first input 1212 of the multiplexer 1210 and the second terminal 214 of the resistive element 210 is coupled to the second input 1214 of the multiplexer 1210. The output 1216 of the multiplexer 1210 is coupled to the input of the attenuator 1410. The output of the attenuator 1410 is coupled to the input of the squaring circuit 1315 and the output of the squaring circuit 1315 is coupled to the input of the low pass filter 1320. The output of the low pass filter 1320 is coupled to the input of the ADC 1220 and the output of the ADC 1220 is coupled to the input of the difference circuit 430.

In this example, the multiplexer 1210 outputs the voltage at the first terminal 212 of the resistive element 210 and the voltage at the second terminal 214 of the resistive element 210 to the input of the attenuator 1410 one at a time.

When the multiplexer 1210 outputs the voltage at the first terminal 212 of the resistive element 210 to the attenuator 1410, the attenuator 1410 attenuates the voltage at the first terminal 212 by the attenuation factor $\alpha$ and outputs the attenuated voltage to the squaring circuit 1315. The squaring circuit 1315 generates a first signal that is proportional to the square of the voltage at the first terminal 212 of the resistive element 210 by a proportionality factor of $\alpha^2 G$, where G is the gain of the squaring circuit 1315. The low pass filter 1320 generates a filtered first signal that is proportional to the square of the root-mean-square of the voltage at the first terminal 212. The ADC 1220 digitizes the filtered first signal and outputs the digital version of the filtered first signal (i.e., first digital signal) to the difference circuit 430.

When the multiplexer 1210 outputs the voltage at the second terminal 214 of the resistive element 210 to the attenuator 1410, the attenuator 1410 attenuates the voltage at the second terminal 214 by the attenuation factor $\alpha$ and outputs the attenuated voltage to the squaring circuit 1315. The squaring circuit 1315 generates a second signal that is proportional to the square of the voltage at the second terminal 214 of the resistive element 210 by a proportionality factor of $\alpha^2 G$. The low pass filter 1320 generates a filtered second signal that is proportional to the square of the root-mean-square of the voltage at the second terminal 214. The ADC 1220 digitizes the filtered second signal and outputs the digital version of the filtered second signal (i.e., second digital signal) to the difference circuit 430.

The difference circuit 430 may then compute the difference between the filtered first signal and the filtered second signal in the digital domain, in which the difference provides a measurement of the average power delivered to the antenna 130. The difference circuit 430 may output the computed difference at output 236 as a digital power measurement signal.

Thus, in this example, one attenuator is used to attenuate the voltage at the first terminal 212 of the resistive element 210 and attenuate the voltage at the second terminal 214 of the resistive element 210 instead of two attenuators. An advantage of this implementation is that the use of one attenuator may help reduce error in the power measurement due to mismatch between two attenuators.

Figure 15:
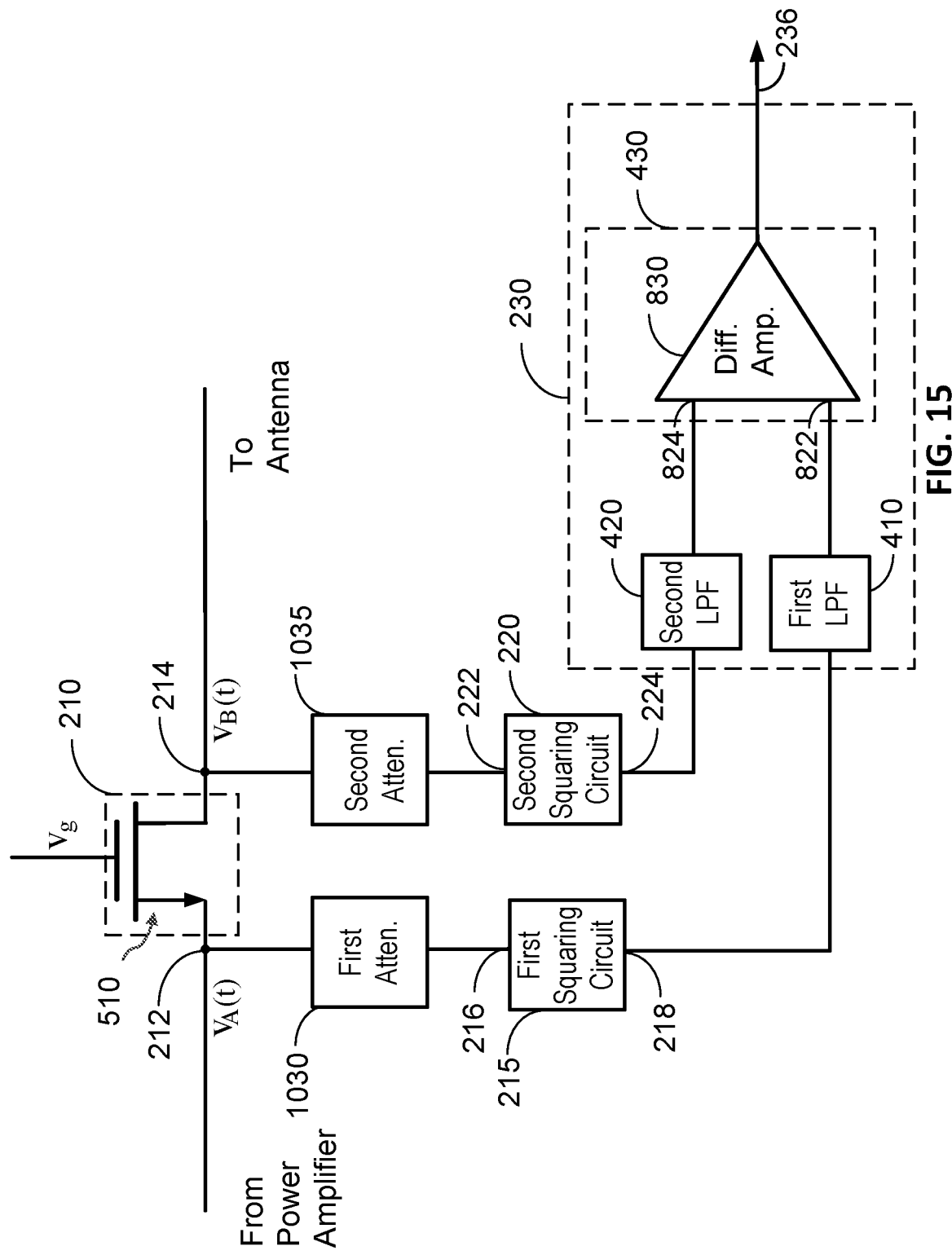
FIG. 15 shows another exemplary implementation of a power measurement circuit according to certain aspects of the present disclosure.

FIG. 15 shows another exemplary implementation of the power measurement circuit 230 according to certain aspects. In this example, the power measurement circuit 230 includes the first low pass filter 410, the second low pass filter 420, and the difference circuit 430 discussed above with reference to FIG. 4. In this example, the difference circuit 430 is implemented with the differential amplifier 830, in which the first input 822 of the differential amplifier 830 is coupled to the output of the first low pass filter 410 and the second input 824 of the differential amplifier 830 is coupled to the output of the second low pass filter 420.

In this example, the first attenuator 1030 attenuates the voltage at the first terminal 212 of the resistive element 210 by the attenuation factor $\alpha$ and outputs the attenuated voltage to the first squaring circuit 215. The first squaring circuit 215 then generates a first signal that is proportional to the square of the voltage at the first terminal 212 of the resistive element 210 by a proportionality factor of $\alpha^2 G$, where G is the gain of the first squaring circuit 215. The first low pass filter 410 generates a filtered first signal that is proportional to the square of the root-mean-square of the voltage at the first terminal 212. The filtered first signal is input to the first input 822 of the differential amplifier 830.

The second attenuator 1035 attenuates the voltage at the second terminal 214 of the resistive element 210 by the attenuation factor $\alpha$ and outputs the attenuated voltage to the second squaring circuit 220. The second squaring circuit 220 then generates a second signal that is proportional to the square of the voltage at the second terminal 214 of the resistive element 210 by a proportionality factor of $\alpha^2 G$, where G is the gain of the second squaring circuit 220. The second low pass filter 420 generates a filtered second signal that is proportional to the square of the root-mean-square of the voltage at the second terminal 214. The filtered second signal is input to the second input 824 of the differential amplifier 830.

The differential amplifier 830 generates an output signal proportional to the difference between the filtered first signal and the filtered second signal, and outputs the output signal at the output 236 as a power measurement signal. In this example, the output signal provides a measurement of the average power delivered to the antenna 130.

Figure 16A:
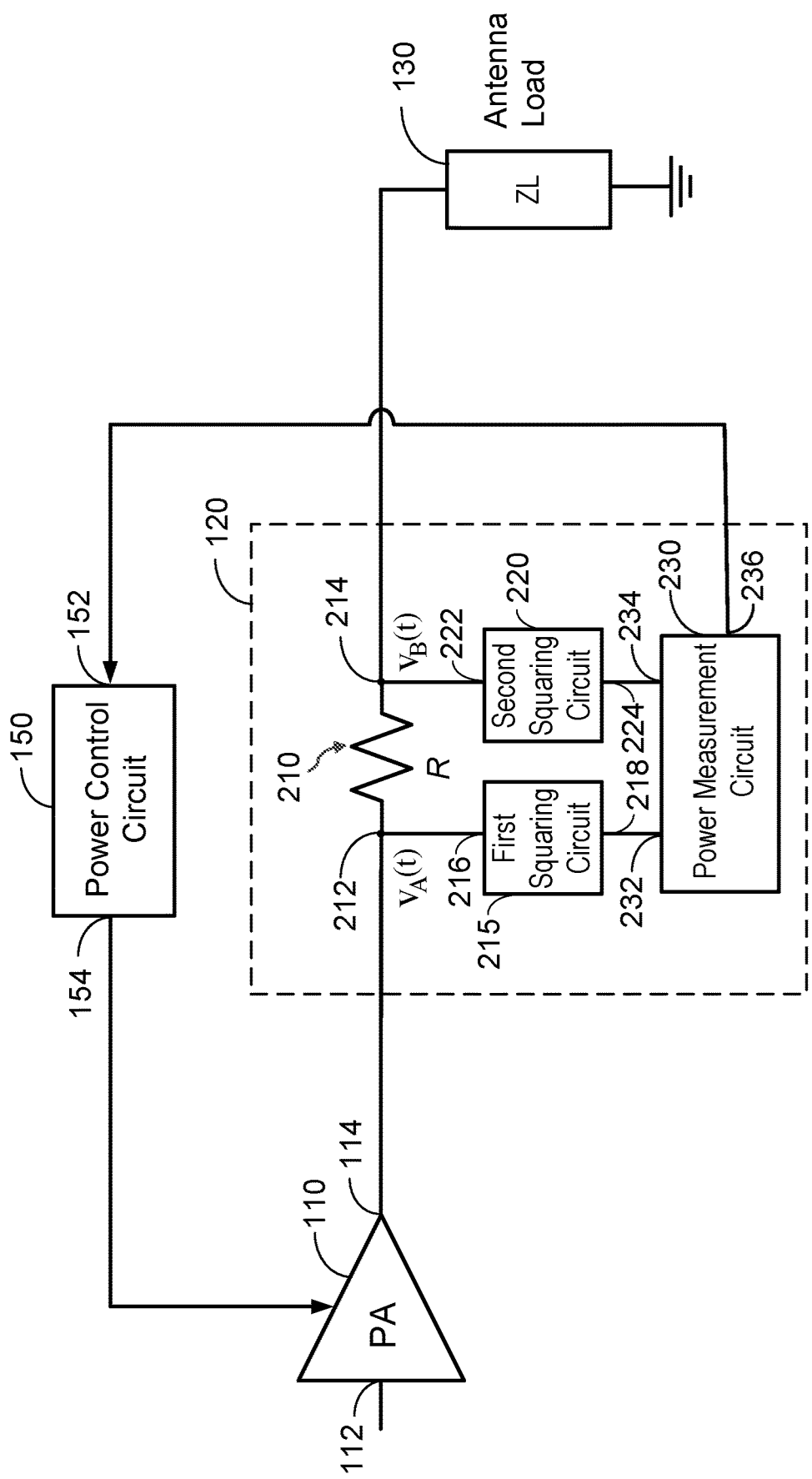
FIG. 16A shows an example of a power control circuit coupled to a power detector according to certain aspects of the present disclosure.

As discussed above, the power control circuit 150 shown in FIG. 1 is configured to control the output power of the power amplifier 110 based on power measurements from the power detector 120. In this regard, FIG. 16A shows an example in which the output 236 of the power measurement circuit 230 is coupled to an input 152 of the power control circuit 150. The power measurement circuit 230 may be implemented using any of the exemplary implementations shown in FIGS. 2 to 10 and 12 to 15. An output 154 of the power control circuit 150 is coupled to the power amplifier 110 to control the output power of the power amplifier 110.

In operation, the power detector 120 outputs the power measurement signal to the power control circuit 150, in which the power measurement signal indicates measured power (e.g., average power) delivered to the antenna 130, as discussed above. The power control circuit 150 then adjusts the output power of the power amplifier 110 based on the power measurement signal. For example, the power control circuit 150 may adjust the output power of the power amplifier 110 based on the measured power to keep the power delivered to the antenna 130 at or close to a target transmission power.

For example, the target transmission power may be set by a power control loop (not shown) based on the distance and/or channel conditions between the transmitter and a wireless device (not shown) receiving the RF signal. The power control loop may be an open power control loop or a closed power control loop. For the case where the antenna 130 is part of an antenna array employing beamforming, the target transmission power may be set by a beamformer based on a respective beamforming weight. The beamforming weight may correspond to a desired transmit beam direction for the antenna array. The target transmission power may also be set based on one or more other parameters.

The power control circuit 150 may also adjust the output power of the power amplifier 110 based on the measured power to prevent the transmission power from exceeding a power limit set by a regulatory agency. In another example, the measured power may be used to detect a failure of the power amplifier 110 and/or the antenna 130. For example, a failure may be detected if the measured power is outside a normal power range.

Figure 16B:
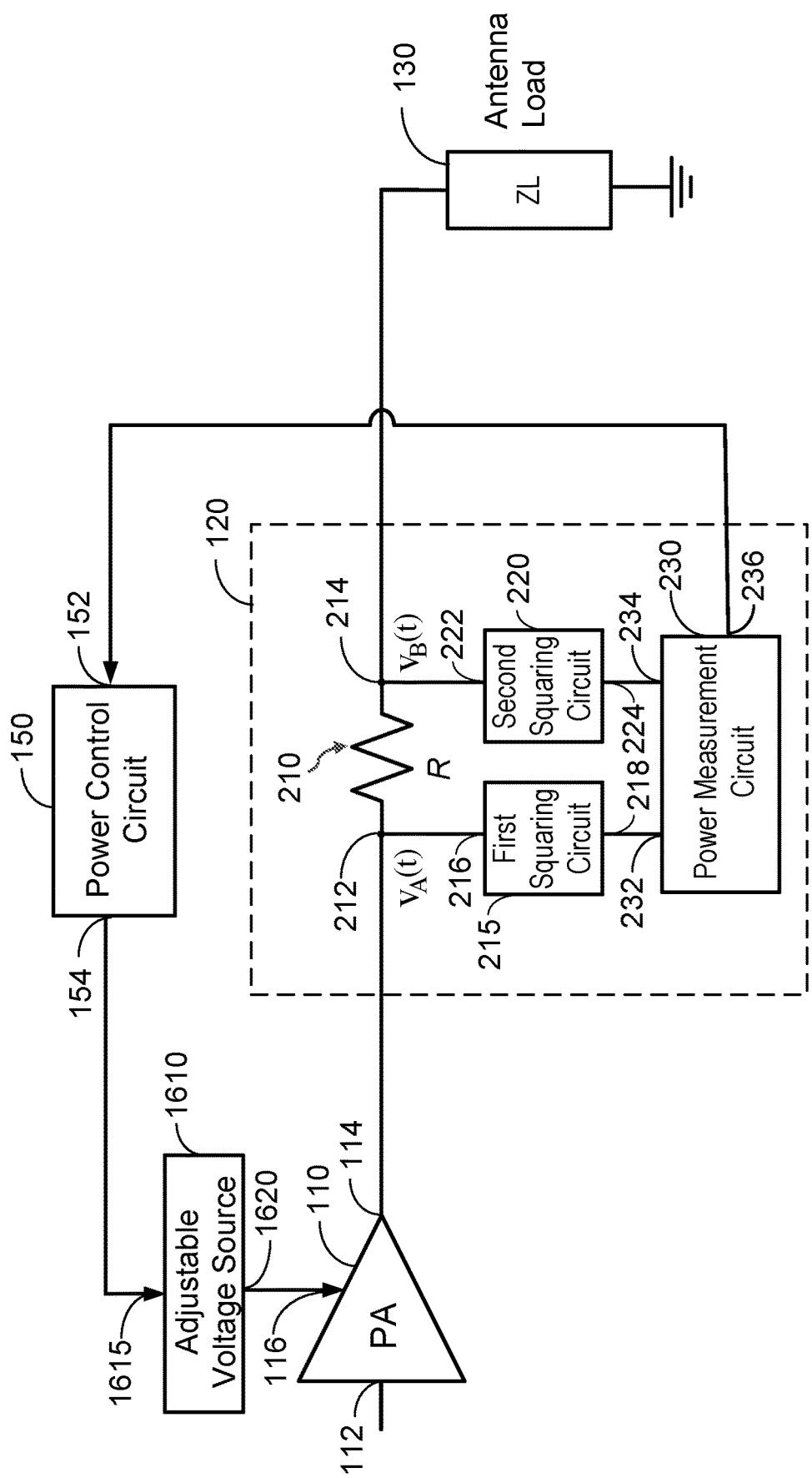
FIG. 16B shows an example in which the power control circuit controls the output power of a power amplifier using an adjustable voltage source according to certain aspects of the present disclosure.

In certain aspects, the power control circuit 150 may adjust the output power of the power amplifier 110 by adjusting the supply voltage to the power amplifier 110. In this regard, FIG. 16B shows an example in which the transmitter includes an adjustable voltage source 1610 configured to provide the power amplifier 110 with a supply voltage having an adjustable voltage level. The adjustable voltage source 1610 may be implemented with a voltage regulator in some implementations.

In the example in FIG. 16B, the adjustable voltage source 1610 has a control input 1615 coupled to the output 154 of the power control circuit 150, and a voltage supply output 1620 coupled to a voltage supply input 116 of the power amplifier 110. In this example, the power control circuit 150 controls the output power of the power amplifier 110 by controlling the voltage level of the supply voltage provided to the power amplifier 110 by the adjustable voltage source 1610. For example, the power control circuit 150 may increase the output power by having the adjustable voltage source 1610 increase the supply voltage and decrease the output power by having the adjustable voltage source 1610 decrease the supply voltage.

Figure 16C:
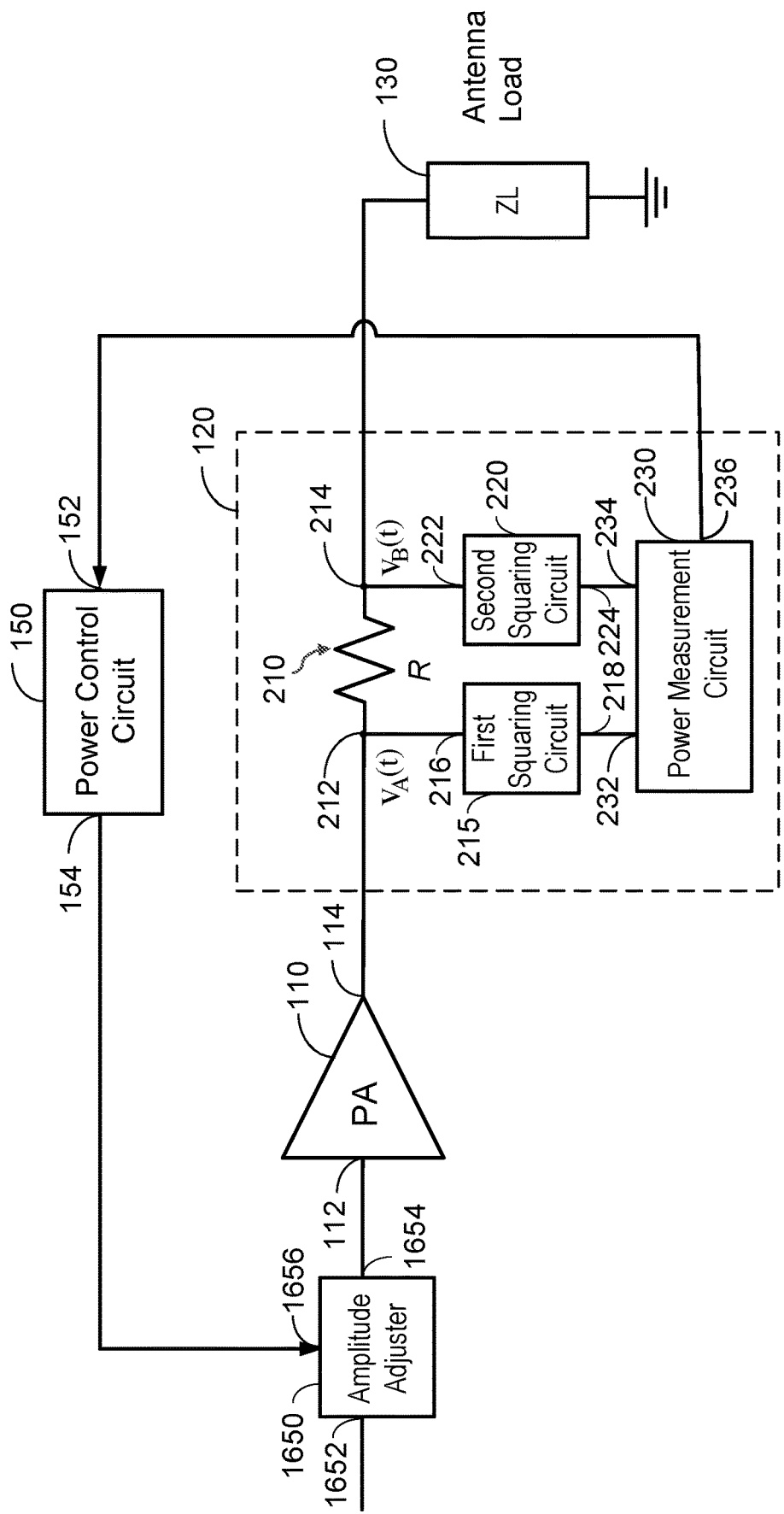
FIG. 16C shows an example in which the power control circuit controls the output power of a power amplifier using an amplitude adjuster according to certain aspects of the present disclosure.

In certain aspects, the power control circuit 150 may adjust the output power of the power amplifier 110 by adjusting the amplitude of the RF signal input to the power amplifier 110. In this regard, FIG. 16C shows an example in which the transmitter includes an amplitude adjuster 1650 configured to adjust the amplitude of the RF signal input to the input 112 of the power amplifier 110. In some implementations, the amplitude adjuster 1650 includes a variable gain amplifier in which the amplitude of the RF signal is adjusted by adjusting the gain of the variable gain amplifier. In other implementations, the amplitude adjuster 1650 includes an attenuator in which the amplitude of the RF signal is adjusted by adjusting the attenuation factor of the attenuator.

In the example in FIG. 16C, the amplitude adjuster 1650 has an input 1652 configured to receive the RF signal, an output 1654 coupled to the input 112 of the power amplifier 110, and a control input 1656 coupled to the output 154 of the power control circuit 150. In this example, the power control circuit 150 controls the output power of the power amplifier 110 by controlling the amplitude adjustment of the RF signal by the amplitude adjuster 1650. For example, the power control circuit 150 may increase the output power by having the amplitude adjuster 1650 increase the amplitude of the RF signal and decrease the output power by having the amplitude adjuster 1650 decrease the amplitude of the RF signal.

It is to be appreciated that the present disclosure is not limited to the above examples for the controlling the output power of the power amplifier 110, and that the power control circuit 150 may control the output power of the power amplifier 110 using another technique.

Figure 17:
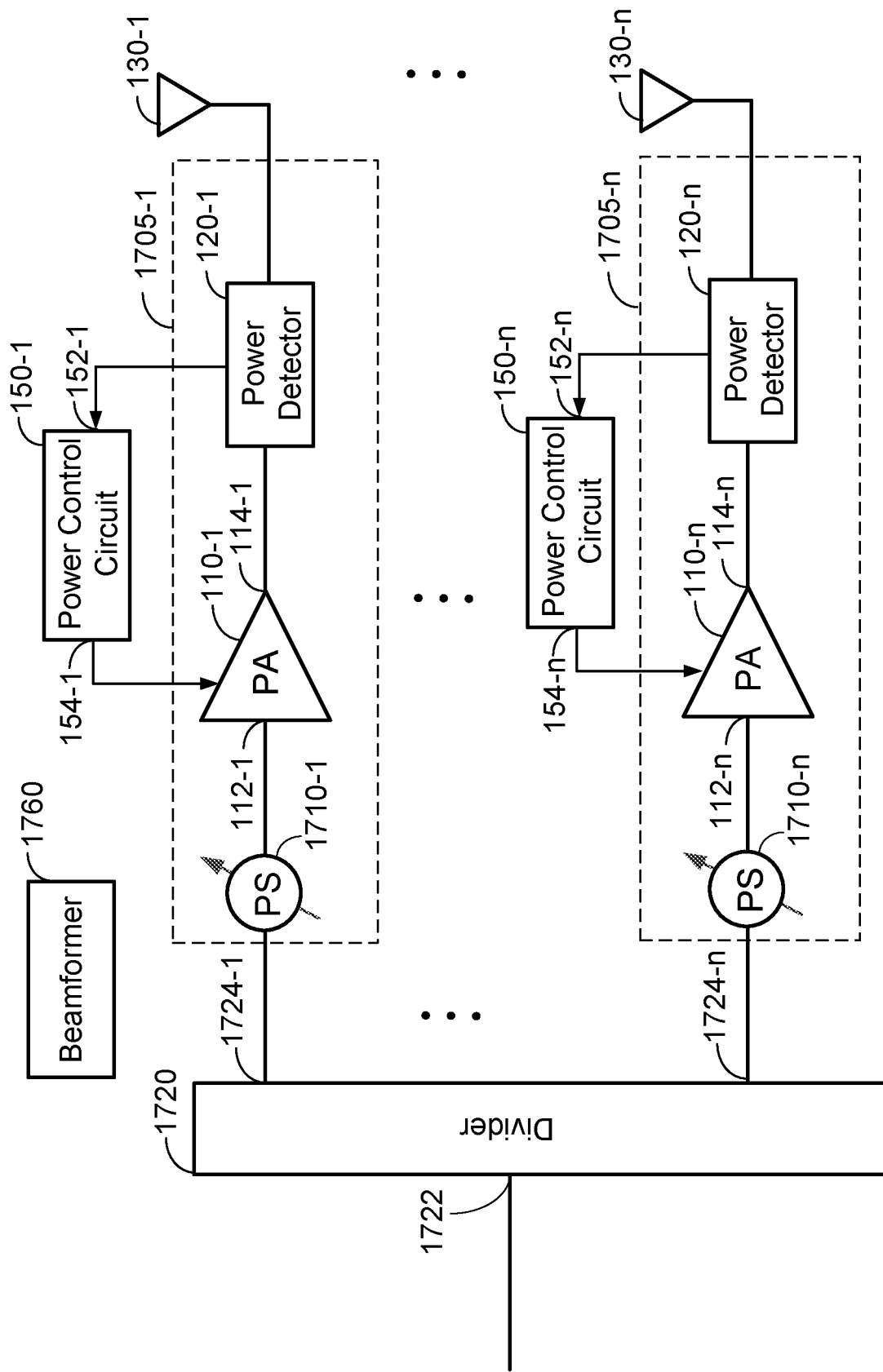
FIG. 17 shows an example of a phased antenna array with which aspects of the present disclosure may be used according to certain aspects of the present disclosure.

In certain aspects, the antenna 130 may be part of a phased antenna array, which allows a wireless device to transmit and/or receive signals with high directivity. In this regard, FIG. 17 shows an example of a phased antenna array including multiple antennas 130-1 to 130-n. In this example, the transmitter includes a divider 1720, and multiple transmit chains 1705-1 to 1705-n. The divider 1720 has an input 1722 and multiple outputs 1724-1 to 1724-n. The divider 1720 is configured to receive an RF signal at the input 1722 (e.g., from a frequency-up converter), split the RF signal into multiple output RF signals, and output each of the multiple RF signals at a respective one of the multiple outputs 1724-1 to 1724-n.

Each transmit chain 1705-1 to 1705-n is coupled between a respective one of the outputs 1724-1 to 1724-n of the divider 1720 and a respective one of the antennas 130-1 to 130-n of the antenna array. Each of the transmit chains 1705-1 to 1705-n includes a respective phase shifter 1710-1 to 1710-n, a respective power amplifier 110-1 to 110-n, and a respective power detector 120-1 to 120-n. Each of the power detectors 120-1 to 120-n may be implemented with any one of the exemplary power detectors 120 shown in FIGS. 2 to 15.

The transmitter may also include multiple power control circuits 150-1 to 150-n in which each power control circuit 150-1 to 150-n corresponds to a respective one of the transmit chains 1710-1 to 1710-n. In this example, the input 152-1 to 152-n of each power control circuit 150-1 to 150-n is coupled to the power detector 120-1 to 120-n in the respective transmit chain 1705-1 to 1705-n to receive a respective power measurement signal. The output 154-1 to 154-n of each power control circuit 150-1 to 150-n may coupled to the power amplifier 110-1 to 110-n in the respective transmit chain 1705-1 to 1705-n.

The transmitter also includes a beamformer 1760 configured to apply beamforming weights to the signals in the transmit chains 1705-1 to 1705-n based on a desired transmit beam direction for the antenna array. In certain aspects, each beamforming weight corresponds to respective one of the transmit chains 1705-1 to 1705-n and each beamforming weight may be complex including a phase shift and an amplitude. In these aspects, the beamformer 1760 may control the phase shift of the phase shifter 1710-1 to 1710-n in each transmit chain 1705-1 to 1705-n based on the phase shift of the respective beamforming weight. For case of illustration, the individual connections between the beamformer 1760 and the phase shifters 1710-1 to 1710-n are not explicitly shown in FIG. 17.

The beamformer 1760 may also set the target transmission power for each power control circuit 150-1 to 150-n based on the amplitude of the respective beamforming weight. In this example, each power control circuit 150-1 to 150-n may adjust the output power of the respective power amplifier 110-1 to 110-n based on the measured power from the respective power detector 120-1 to 120-n in order to keep the power delivered to the respective antenna 130-1 to 130-n at or close to the target transmission power. Each power control circuit 150-1 to 150-n may adjust the output power of the respective power amplifier 110-1 to 110-n using any of the techniques discussed above. For case of illustration, the individual connections between the beamformer 1760 and the power control circuits 150-1 to 150-n are not explicitly shown in FIG. 17. It is to be appreciated that the target transmission power for each power control circuit 150-1 to 150-n may also be set based on or more other parameters in addition to the amplitude of the respective beamforming weight.

Figure 18:
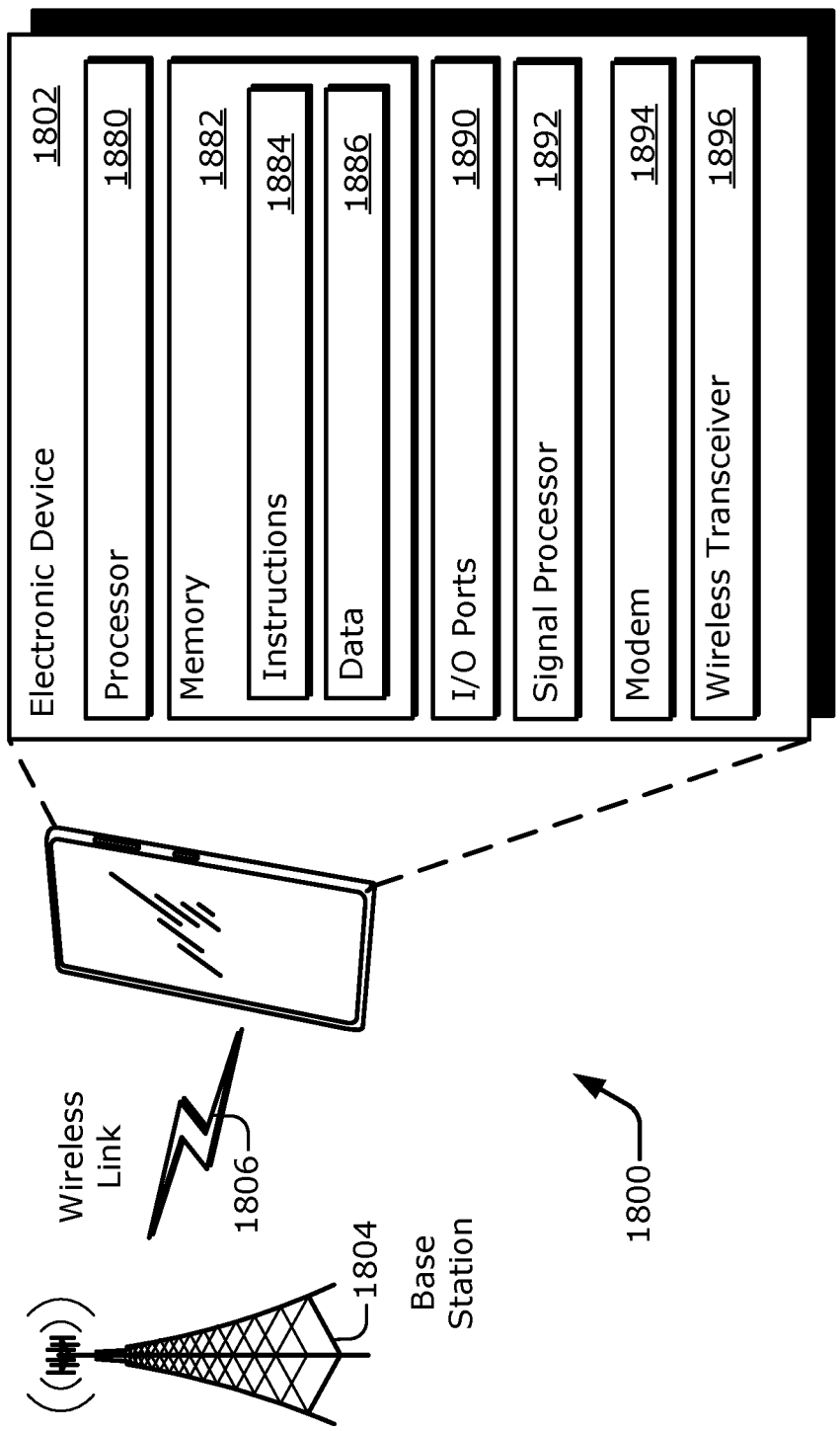
FIG. 18 shows an exemplary environment including an electronic device that includes a transceiver according to certain aspects of the present disclosure.

FIG. 18 is a diagram of an environment 1800 including an electronic device 1802 that includes a wireless transceiver 1896. The transceiver 1896 may include any one of the transceivers shown in FIGS. 2 to 17. In the environment 1800, the electronic device 1802 communicates with a base station 1804 through a wireless link 1806. As shown, the electronic device 1802 is depicted as a smart phone. However, the electronic device 1802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1804 communicates with the electronic device 1802 via the wireless link 1806, which may be implemented as any suitable type of wireless link. Although depicted as a base station tower of a cellular radio network, the base station 1804 may represent or be implemented as another device, such as a satellite, terrestrial broadcast tower, access point, peer to peer device, mesh network node, fiber optic line, another electronic device generally as described above, and so forth. Hence, the electronic device 1802 may communicate with the base station 1804 or another device via a wired connection, a wireless connection, or a combination thereof. The wireless link 1806 can include a downlink of data or control information communicated from the base station 1804 to the electronic device 1802 and an uplink of other data or control information communicated from the electronic device 1802 to the base station 1804. The wireless link 1806 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1802 includes a processor 1880 and a memory 1882. The memory 1882 may be or form a portion of a computer readable storage medium. The processor 1880 may include any type of processor, such as an application processor or a multi-core processor, that is configured to execute processor-executable instructions (e.g., code) stored by the memory 1882. The memory 1882 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1882 is implemented to store instructions 1884, data 1886, and other information of the electronic device 1802, and thus when configured as or part of a computer readable storage medium, the memory 1882 does not include transitory propagating signals or carrier waves.

The electronic device 1802 may also include input/output ports 1890. The I/O ports 1890 enable data exchanges or interaction with other devices, networks, or users or between components of the device.

The electronic device 1802 may further include a signal processor (SP) 1892 (e.g., such as a digital signal processor (DSP)). The signal processor 1892 may function similar to the processor and may be capable of executing instructions and/or processing information in conjunction with the memory 1882.

For communication purposes, the electronic device 1802 also includes a modem 1894, a wireless transceiver 1896, and one or more antennas (not shown). The wireless transceiver 1896 provides connectivity to respective networks and other electronic devices connected therewith using RF wireless signals. The wireless transceiver 1896 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 19:
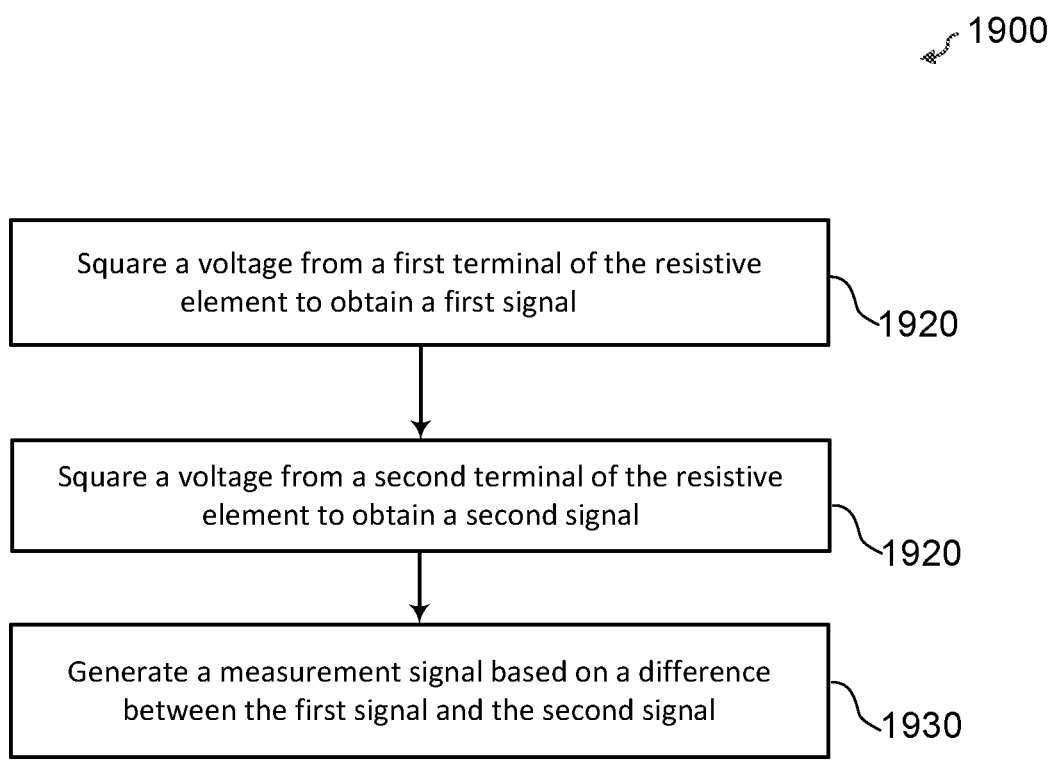
FIG. 19 is a flowchart illustrating a method for measuring power according to certain aspects of the present disclosure.

FIG. 19 illustrates an exemplary method 1900 for measuring power using a resistive element coupled between a power amplifier and an antenna according to certain aspects. The resistive element may correspond to resistive element 210, the power amplifier may correspond to power amplifier 110, and the antenna may correspond to antenna 130. In some implementations, the resistive element is implemented with a power switch (e.g., power switch 510).

At block 1910, a voltage from a first terminal of the resistive element is squared to obtain a first signal. For example, the voltage from the first terminal (e.g., first terminal 212) may be squared by the first squaring circuit 215. The first squaring circuit 215 may be implemented with a transistor (e.g., first transistor 815), a multiplier, or another type of squaring circuit. In certain aspects, the voltage from the first terminal may be attenuated by an attenuator (e.g., attenuator 1030) before the squaring.

At block 1920, a voltage from a second terminal of the resistive element is squared to obtain a second signal. For example, the voltage from the second terminal (e.g., second terminal 214) may be squared by the second squaring circuit 220. The second squaring circuit 220 may be implemented with a transistor (e.g., second transistor 820), a multiplier, or another type of squaring circuit. In certain aspects, the voltage from the second terminal may be attenuated by an attenuator (e.g., attenuator 1035) before the squaring. In certain aspects, the voltage from the first terminal and the voltage from the second terminal may be squared by the same squaring circuit (e.g., squaring circuit 1315) one at a time using a multiplexer (e.g., multiplexer 1210).

At block 1930, a measurement signal is generated based on a difference between the first signal and the second signal. The measurement signal may be generated by a difference circuit (e.g., difference circuit 330 or 430). In one example, the difference circuit may be implemented with a differential amplifier (e.g., differential amplifier 830). In this example, the measurement signal may be proportional to the difference between the first signal and the second signal. In another example, the difference circuit may be implemented with a digital circuit that computes the difference between the first signal and the second signal in the digital domain to generate the measurement signal.

In certain aspects, the method 1900 may further include low pass filtering the measurement signal. In another aspects, the method may further include low pass filtering the first signal to obtain a filtered first signal, and low pass filtering the second signal to obtain a filtered second signal, wherein the measurement signal is based on a difference between the filtered first signal and the filtered second signal.

It is to be appreciated that the present disclosure is not limited to the exemplary terms used above to describe aspects of the present disclosure, and that the present disclosure covers equivalent terms. For example, the terminals of the resistive element 210 may also be referred to ports, the input and output of the resistive element 210, the two ends of the resistive element 210, or another term. A difference circuit may also be referred to as subtraction circuit, or another term. A squaring circuit may also be referred to as a square law device, a square law detector, a squaring device, or another term. The inductors of a transformer may also be referred as windings of the transformer or sides of the transformer (e.g., primary side and secondary side).

As used herein, a squaring circuit is a circuit configured to generate a signal (e.g., a voltage or a current) at its output that is proportional to a square of a voltage or current at its input.

It is to be appreciated that, as used herein, the term "proportional" covers the possibility of a proportionality factor of one. For example, a signal that is proportional to a square of a voltage covers the possibility that the signal is equal to the square of the voltage, in which case the proportionality factor is one.

The switch controller 550, the power measurement circuit 230, and the power control circuit 150 discussed above may each be implemented with a general-purpose processor, a digital signal processor (DSP), a state machine, an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a resistive element including a first terminal and a second terminal, wherein the resistive element is coupled between a power amplifier and an antenna;
   a first squaring circuit including an input and an output, wherein the input of the first squaring circuit is coupled to the first terminal of the resistive element;
   a second squaring circuit including an input and an output, wherein the input of the second squaring circuit is coupled to the second terminal of the resistive element; and
   a differential amplifier including a first input, a second input, and an output, wherein the first input of the differential amplifier is coupled to the output of the first squaring circuit, and the second input of the differential amplifier is coupled to the output of the second squaring circuit.

2. The apparatus of claim 1, wherein:
   the first squaring circuit comprises a first transistor; and
   the second squaring circuit comprises a second transistor.

3. The apparatus of claim 2, wherein:
   a gate of the first transistor is coupled to the first terminal of the resistive element;
   a drain of the first transistor is coupled to the first input of the differential amplifier;
   a gate of the second transistor is coupled to the second terminal of the resistive element; and
   a drain of the second transistor is coupled to a second input of the differential amplifier.

4. The apparatus of claim 1, further comprising a low pass filter coupled to the output of the differential amplifier.

5. The apparatus of claim 1, wherein the resistive element comprises a power switch.

6. The apparatus of claim 5, further comprising a low noise amplifier coupled to the antenna.

7. The apparatus of claim 1, wherein the antenna is one of multiple antennas of a phased antenna array.

8. The apparatus of claim 1, further comprising a power control circuit configured to control an output power of the power amplifier based on a signal at the output of the differential amplifier.

9. An apparatus, comprising:
   a resistive element including a first terminal and a second terminal, wherein the resistive element is coupled between a power amplifier and an antenna;
   a first squaring circuit including an input and an output, wherein the input of the first squaring circuit is coupled to the first terminal of the resistive element;
   a second squaring circuit including an input and an output, wherein the input of the second squaring circuit is coupled to the second terminal of the resistive element;
   a transformer, wherein the transformer comprises:
      a first inductor coupled between the first terminal of the resistive element and the second terminal of the resistive element; and
      a second inductor coupled between the input of the first squaring circuit and the input of the second squaring circuit, wherein the second inductor is magnetically coupled with the first inductor; and
   a difference circuit coupled to the output of the first squaring circuit and the output of the second squaring circuit.

10. The apparatus of claim 9, wherein:
    the first squaring circuit comprises a first transistor;
    a gate of the first transistor is coupled to a first terminal of the second inductor;
    a drain of the first transistor is coupled to the difference circuit;
    the second squaring circuit comprises a second transistor;
    a gate of the second transistor is coupled to a second terminal of the second inductor; and
    a drain of the second transistor is coupled to the difference circuit.

11. The apparatus of claim 10, wherein:
    the difference circuit comprises a differential amplifier including a first input, a second input, and an output;
    the first input of the differential amplifier is coupled to the drain of the first transistor; and
    the second input of the differential amplifier is coupled to the drain of the second transistor.

12. The apparatus of claim 11, further comprising a low pass filter coupled to the output of the differential amplifier.

13. The apparatus of claim 9, wherein:
    the difference circuit comprises a differential amplifier including a first input, a second input, and an output;
    the first input of the differential amplifier is coupled to the output of the first squaring circuit; and
    the second input of the differential amplifier is coupled to the output of the second squaring circuit.

14. The apparatus of claim 13, further comprising a low pass filter coupled to the output of the difference circuit.

15. The apparatus of claim 9, wherein the resistive element comprises a power switch.

16. The apparatus of claim 15, further comprising a low noise amplifier coupled to the antenna.

17. The apparatus of claim 9, wherein the antenna is one of multiple antennas of a phased antenna array.

18. The apparatus of claim 9, further comprising a power control circuit configured to control an output power of the power amplifier based on an output signal of the difference circuit.

19. A method for measuring power using a resistive element coupled between a power amplifier and an antenna, the method comprising:
   squaring a voltage from a first terminal of the resistive element to obtain a first signal;
   squaring a voltage from a second terminal of the resistive element to obtain a second signal;
   inputting the first signal to a first input of a differential amplifier;
   inputting the second signal to a second input of the differential amplifier; and
   obtaining a measurement signal at an output of the differential amplifier.

20. The method of claim 19, further comprising low pass filtering the measurement signal.

* * * * *